United States Patent
Fujikawa et al.

(10) Patent No.: US 8,025,923 B2
(45) Date of Patent: Sep. 27, 2011

(54) METHOD FOR MANUFACTURING A STRUCTURE

(75) Inventors: Shigenori Fujikawa, Wako (JP); Toyoki Kunitake, Wako (JP); Hiromi Takaemoto, Wako (JP); Mari Koizumi, Wako (JP); Hideo Hada, Kawasaki (JP); Sanae Furuya, Kawasaki (JP)

(73) Assignees: Tokyo Ohka Kogyo Co., Ltd., Kawasaki-shi (JP); Riken, Wako-shi (JP)

( * ) Notice: Subject to any disclaimer, the term of this patent is extended or adjusted under 35 U.S.C. 154(b) by 502 days.

(21) Appl. No.: 12/202,972

(22) Filed: Sep. 2, 2008

(65) Prior Publication Data
US 2009/0087625 A1 Apr. 2, 2009

(30) Foreign Application Priority Data
Sep. 3, 2007 (JP) ................................ 2007-228337

(51) Int. Cl.
*B05D 1/32* (2006.01)
(52) U.S. Cl. ...... 427/259; 427/96.1; 427/97.1; 427/97.3; 427/97.4; 427/97.5; 427/256; 427/258; 427/261; 427/264; 427/265; 427/270; 977/700; 977/840; 977/890; 977/892
(58) Field of Classification Search .................. 427/259, 427/264, 270, 272, 97.3, 97.4, 97.5, 96.1, 427/97.1, 97.6, 98.4, 98.5, 98.6, 99.2, 99.3, 427/99.4, 256, 258, 261, 265; 977/810, 811, 977/892, 890, 700, 840, 888
See application file for complete search history.

(56) References Cited

U.S. PATENT DOCUMENTS
7,662,299 B2 * 2/2010 Subramanian et al. ......... 216/11
2002/0190251 A1 * 12/2002 Kunitake et al. ................ 257/43

FOREIGN PATENT DOCUMENTS
EP 1767491 A1 * 3/2007
JP 2005-205584 8/2005
JP 2006-297575 11/2006

OTHER PUBLICATIONS
Caruso, "Nanoengineering of Particle Surfaces", Advanced Materials, vol. 13, No. 1, pp. 11-22, (2001).

* cited by examiner

*Primary Examiner* — Frederick J Parker
*Assistant Examiner* — Alex Rolland
(74) *Attorney, Agent, or Firm* — Knobbe Martens Olson & Bear LLP

(57) ABSTRACT

A method of manufacturing a structure, including forming a composite film composed of a coating film and an organic or inorganic film on top of a substrate by forming the coating film on the surface of a template provided on top of the substrate; forming the organic or inorganic film on the surface of the coating film, and removing a portion of the organic or inorganic film and a portion of the coating film; forming a second coating film on the surface of the composite film; forming an organic coating film on the substrate that covers the second coating film; removing a portion of the second coating film; and forming a structure composed of a metal or metal oxide later on the substrate by removing all residues left on the substrate except for the coating film and the second coating film.

12 Claims, 6 Drawing Sheets

METHOD FOR MANUFACTURING A STRUCTURE

TECHNICAL FIELD

The present invention relates to a method of producing a structure that includes a metal or metal oxide (such as silica ($SiO_2$)), and a structure produced using the method.

Priority is claimed on Japanese Patent Application No. 2007-228337, filed Sep. 3, 2007, the content of which is incorporated herein by reference.

BACKGROUND ART

In recent years, because of their potential application in all manner of fields, techniques for fabricating microscopic structures have been the subject of intensive research and development. For example, structural bodies that include structures of nanometer size (so-called nanomaterials) exhibit different physical and chemical properties from their corresponding bulk materials, and are therefore attracting enormous interest, both from the fundamental research perspective and the applied research perspective. For example, nanomaterials having a hollow three dimensional structure such as a cylindrical shape are expected to have important roles in a variety of different fields, including inclusion chemistry, electrochemistry, materials science, biomedicine, sensors, catalysts and separation techniques. Furthermore, techniques for fabricating line-shaped micropatterns can be linked directly to the fabrication of integrated circuits and increased integration levels, and are therefore the subject of extremely intensive research and development in fields such as the semiconductor industry.

Conventional methods of producing microscopic structures include methods known as template methods, and methods that use lithography techniques. For example, Non-Patent Document 1 proposes a method of producing a nanomaterial having a spherical capsule-shaped hollow three dimensional structure by dispersing template microparticles in a solution, coating the surface of the template microparticles with a thin film, and then removing the template microparticles.

Further, the applicants of the present invention have proposed methods of producing nanostructures by coating the surface of a template having a nanopattern formed thereon with a coating film or a composite film of a metal oxide and an organic compound, and then removing the template (see Patent Documents 1 and 2).

Furthermore, methods of fabricating microscopic metal structures are also known, including (1) methods in which a lithography technique is used to form a microscopic pattern on top of a metal layer, and that microscopic pattern is then used as a mask for etching the metal layer, and (2) methods in which a metal plating technique is used to fill a microscopic pattern formed using a lithography technique.

[Non-Patent Document 1] Advanced Materials, 13(1), pp. 11 to 22 (2001)

[Patent Document 1]
Japanese Unexamined Patent Application, First Publication No. 2005-205584

[Patent Document 2]
Japanese Unexamined Patent Application, First Publication No. 2006-297575

DISCLOSURE OF THE INVENTION

Problems that the Invention is to Solve

However, using conventional methods, fabrication of a favorably shaped structure in which at least a portion of the structure has dimensions at the nanometer level (namely, a nanostructure), such as a structure composed of layers having thickness values within a range from several nanometers to several tens of nanometers, has proven difficult. In particular, line-shaped or columnar structures tend to suffer from poor self-supporting properties as the aspect ratio (the ratio of the height relative to the width) is increased, meaning forming such structures on a substrate with favorable shape retention has proven extremely problematic.

The present invention has been designed in light of the above circumstances, and has an object of providing a method of simply producing a microscopic structure of favorable shape, and also providing a structure produced using this method.

Means for Solving the Problems

In order to achieve the above object, the present invention adopts the aspects described below.

Namely, a first aspect of the present invention is a method of producing a structure, including:

a composite film formation step that forms a composite film composed of a coating film and an organic film or inorganic film on top of a substrate by conducting Steps (1) to (3) below:

(1) forming the coating film composed of a metal layer or a metal oxide layer on the surface of a template provided on top of the substrate, (2) forming the organic film or inorganic film on the surface of the coating film, and (3) removing a portion of the organic film or inorganic film and the coating film;

a second coating film formation step that forms a second coating film composed of a metal layer or a metal oxide layer on the surface of the composite film;

a coating step that, following formation of the second coating film, forms an organic coating film on the substrate that covers said second coating film;

a removal step that removes a portion of the second coating film, the side surfaces of which are at least partially supported by the organic coating film; and a structure formation step that forms a structure composed of a metal layer or metal oxide layer on the substrate by removing all residues left on the substrate except for the coating film and the second coating film.

A second aspect of the present invention is a structure produced using the method of the first aspect described above.

Advantages of the Invention

The present invention is able to provide a method of simply producing a microscopic structure of favorable shape, as well as a structure produced using this method.

DESCRIPTION OF THE REFERENCE SYMBOLS

Figure 1:
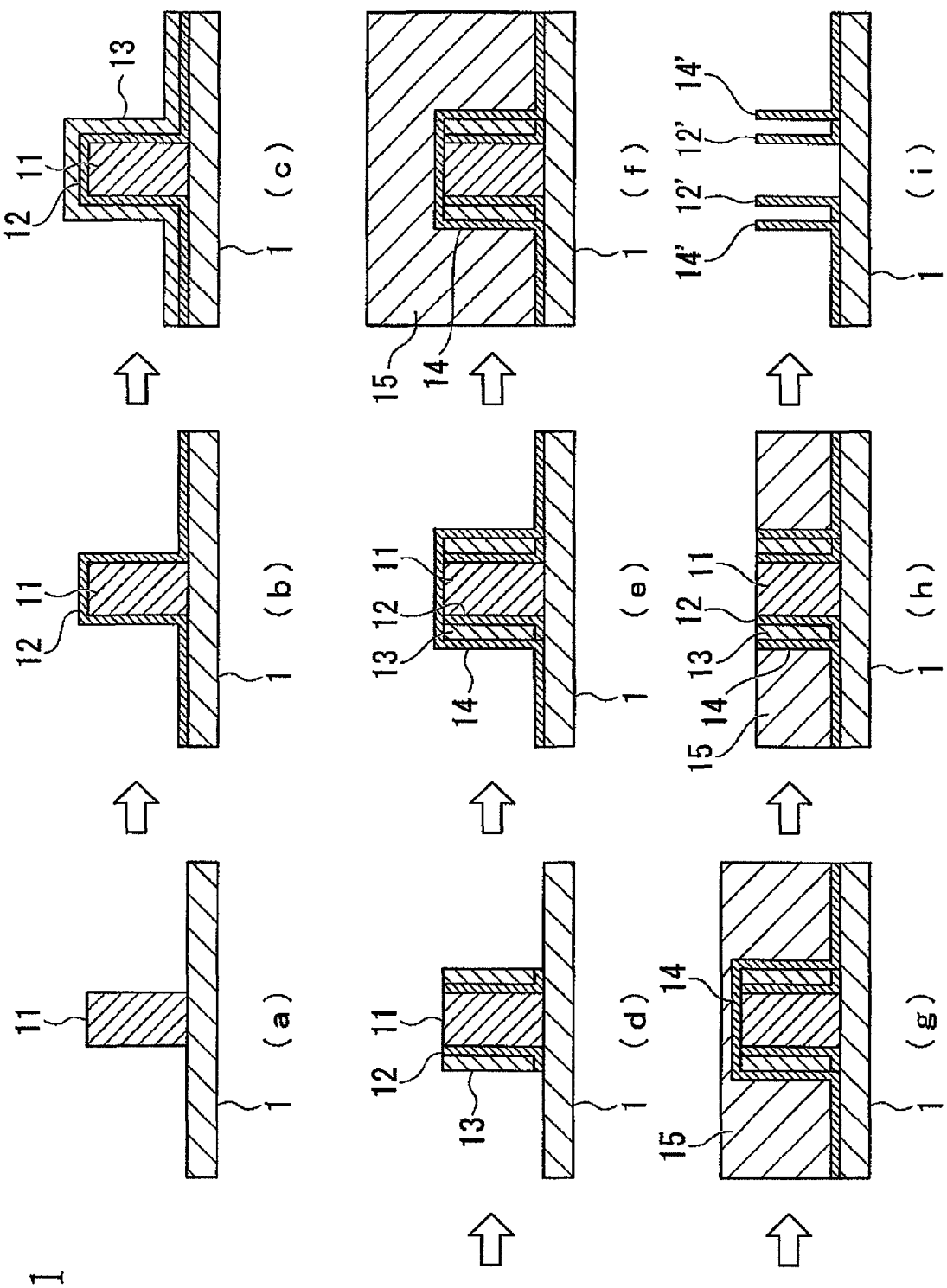
FIG. 1 is a flowchart showing a first embodiment of a production method according to the present invention.

1 . . . substrate, 11 . . . template, 12 . . . coating film, 13 . . . organic film, 14 . . . coating film, 15 . . . organic coating film, 12' . . . structure, 14' . . . structure

BEST MODE FOR CARRYING OUT THE INVENTION

Method of Producing Structure

<Composite Film Formation Step>
[Step (1)]

In Step (1), a coating film composed of a metal layer or metal oxide layer is formed on the surface of a template provided on top of a substrate.
(Substrate, Template)

In Step (1), first, a substrate with a template provided thereon is prepared.

There are no particular restrictions on the substrate, provided a template is able to formed on top of the substrate. Typical examples of the substrate include substrates composed of a metal such as silicon, copper, chrome, iron or aluminum, substrates composed of an inorganic material such as glass, titanium dioxide, silica or mica, and substrates composed of an organic compound such as an acrylic sheet, polystyrene, cellulose, cellulose acetate or a phenolic resin. Further, an organic or inorganic antireflective film may be provided on the surface of the substrate.

Particularly in those cases where a coating film is formed using the type of metal oxide layer-forming material described below, substrates having a surface that includes no functional groups capable of reacting with the metal compound (W) are preferred, as such substrates inhibit formation of the coating film on the substrate surface, meaning the coating film is formed selectively on the surface of the template (indicating excellent coating selectivity).

Specific examples of preferred substrates include silicon substrates, graphite, Teflon (a registered trademark), acrylic sheets, polystyrene and phenolic resins.

There are no particular restrictions on factors such as the size and shape of the substrate. The substrate need not necessarily have a flat surface, and substrates of all manner of materials and shapes may be selected as is appropriate. Namely, all manner of substrates can be used, including substrates having a curved surface, and flat sheets having an uneven surface or thin flakes.

There are no particular restrictions on the template, provided the spirit of the present invention is retained, and examples include templates formed from an organic material such as a resin or the like. Further, in those cases where the coating layer is composed of a metal oxide layer, a template formed from an inorganic material such as a metal or the like may also be used.

Specific examples of templates that may be used include templates formed using a lithography process, templates formed using a contact printing process, templates formed using an imprinting process, templates formed using a mechanical micromachining process, templates formed via LIGA (LIthographie, Galvanoforming und Abformung), and templates formed by beam writing. Of these, templates formed using a lithography process are preferred.

Furthermore, a template prepared by subjecting the surface of an aforementioned template to a physical treatment and/or a chemical treatment may also be used as the template. Examples of the physical and/or chemical treatment include polishing, adhesion operations that involve forming a thin film or the like on the template surface, plasma treatments, solvent treatments, chemical decomposition of the template surface, heat treatments, and drawing treatments.

There are no particular restrictions on the shape and size of the template, which may be set appropriately in accordance with the shape and size of the target structure.

Specific examples of template shapes that can be employed include rectangular shapes, circular pillars, holes, lines, network structures or branched structures including such shapes, polygonal shapes and composite or repeating structures thereof, circuit-like structures such as those seen in integrated circuits, and lattice shapes.

For example, in a case where a line-shaped structure is to be formed, a line pattern having a rectangular cross-section can be used favorably as the template. In such a case, as described below, by forming a composite film composed of a coating film and an organic film or inorganic film and then a second coating film on the template surface, and subsequently removing the upper portions of these films, a structure containing a plurality of lines formed from the side wall portions of the coating film and the second coating film (in which the line width is equivalent to the thickness of the coating film and the line height is equal to the height of the remaining side wall portion) is formed on top of the substrate.

Furthermore, in a case where a cylinder-shaped structure is to be formed, a hole pattern or columnar pattern is preferably formed as the template. In such a case, by forming a composite film and a second coating film on the template surface and subsequently removing the upper portions of these films in the same manner as described above, a cylinder-shape structure formed from the side wall portions of the coating film and the second coating film (in which the outer diameter of the cylinder is substantially equal to the inner diameter of the hole pattern or the outer diameter of the columnar pattern) is formed on top of the substrate.

There are no particular restrictions on the height of the template, which may be set appropriately in accordance with factors such as the size and shape of the target structure. For example, the template height may be set within a range from several nm to several μm, but is preferably within a range from 50 to 500 nm.

There are no particular restrictions on the material used for forming the template, provided it is able to be removed without causing significant damage to the coating films (namely, the coating film formed in the composite film formation step and the second coating film), and the material may be selected appropriately with due consideration of factors such as the material used for forming the coating films, and the chemical resistance and mechanical strength of the coating films.

In the present invention, an organic material is preferred as the template material. In such cases, the template can be removed easily by plasma, ozone oxidation, elution or firing or the like. Furthermore, in those cases where the coating film is formed from a metal oxide layer, metals can also be used favorably as the template material. In this case, the template can be removed without damaging the coating films, for example by dissolving the metal using an acid.

In those cases where the template is formed from an organic material, template-forming materials such as those described below can be used favorably as the material for forming the template.

[Template-Forming Material]

Template-forming materials that can be used favorably in the present invention typically include an organic compound with a molecular weight of at least 500. Provided the molecular weight of this organic compound is at least 500, a template with superior strength and shape can be formed. Further, a template of nanolevel size can be formed more readily. Furthermore a template formed using such a template-forming material also offers the advantage of being readily removable by etching with oxygen gas or hydrogen gas or the like.

As this organic compound, the types of compound typically used as the base component of film-forming materials can be used. Here, the term "base component" describes an organic compound having a film-forming ability.

The above organic compounds can be broadly classified into low molecular weight organic compounds having a molecular weight of at least 500 but not more than 2,000 (hereafter also referred to as "low-molecular compounds"), and high molecular weight compounds having a molecular weight that is greater than 2,000. As the low-molecular compound, a non-polymer is typically used. As the high-molecular compound, a resin (a polymer or copolymer) is typically used, and in such cases, the "molecular weight" refers to the polystyrene equivalent weight average molecular weight determined by GPC (gel permeation chromatography). Hereafter, those cases where the simplified term "resin" is used refer to cases in which the molecular weight is 2,000 or greater.

A compound having a hydrophilic group is preferred as the organic compound, as it facilitates formation of the coating film on the template surface.

As this hydrophilic group, one or more groups selected from the group consisting of a hydroxyl group, carboxyl group, carbonyl group, ester group, amino group and amide group is preferably used. Of these groups, a hydroxyl group (and particularly an alcoholic hydroxyl group or phenolic hydroxyl group), a carboxyl group or an ester group are particularly preferred. Of these, one or more groups selected from the group consisting of a carboxyl group, alcoholic hydroxyl group and phenolic hydroxyl group is particularly desirable.

In those cases where the organic compound is a high-molecular compound, the compound preferably contains at least 0.2 equivalents, and more preferably 0.5 to 0.8 equivalents, of the hydrophilic group. This means that when the high-molecular compound is composed of a structural unit having the hydrophilic group and other structural units, the former structural unit represents at least 20 mol %, and more preferably 50 to 80 mol % of all the structural units.

In those cases where the organic compound is a low-molecular compound, each molecule of the low-molecular compound preferably includes 1 to 20 equivalents, and moreover preferably 2 to 10 equivalents, of the hydrophilic group. Here, the expression "each molecule includes 1 to 20 equivalents of the hydrophilic group" means that 1 to 20 hydrophilic groups exist within a single molecule of the compound.

In terms of the method used for forming the template, as described above, a lithography process is preferred.

In a lithography process, a resist composition is used, which is a material that exhibits radiation sensitivity. There are no particular restrictions on this resist composition, and any of the conventional resist compositions that have been proposed may be appropriately selected and used. These resist compositions include positive resist compositions in which the alkali solubility increases upon exposure, and negative resist compositions in which the alkali solubility decreases upon exposure. In the present invention, a positive resist composition is particularly preferred.

As the resist composition, a chemically amplified resist composition including a base component (A) that exhibits changed alkali solubility under the action of acid (hereafter also referred to as "component (A)") and an acid generator component (B) that generates acid upon exposure (hereafter also referred to as "component (B)") is preferred, as such a composition exhibits superior levels of sensitivity and resolution and the like.

There are no particular restrictions on the chemically amplified resist composition, which may be selected appropriately from the multitude of chemically amplified resist compositions that have already been proposed. A typical chemically amplified resist composition includes a base component (A') that exhibits changed alkali solubility under the action of acid (hereafter also referred to as "component (A')") and an acid generator component (B') that generates acid upon irradiation with some form of radiation (hereafter also referred to as "component (B')").

When the chemically amplified resist composition is a negative resist composition, a base component that exhibits reduced alkali solubility under the action of acid is used as the component (A'), and a cross-linking agent is also blended with the negative resist composition.

In the negative resist composition, when acid is generated from the component (B') upon exposure, the action of this acid causes cross-linking between the component (A') and the cross-linking agent, and the component (A)' changes from an alkali-soluble state to an alkali-insoluble state. Accordingly, if an organic film (resist film) obtained by applying the negative resist composition to a substrate is selectively exposed, then the exposed portions become alkali-insoluble, whereas the unexposed portions remain alkali-soluble, meaning alkali developing can then be used to remove only the unexposed portions, thereby forming a resist pattern (the template).

As the component (A') of the negative resist composition, an alkali-soluble resin is generally used, and as this alkali-soluble resin, it is preferable to use a resin having a structural unit derived from at least one of an α-(hydroxyalkyl)acrylic acid and a lower alkyl ester of an α-(hydroxyalkyl)acrylic acid, as such a resin enables formation of a satisfactory resist pattern with minimal swelling. Here, the term "α-(hydroxyalkyl) acrylic acid" refers to one or both of acrylic acid, in which a hydrogen atom is bonded to the carbon atom on the α-position having the carboxyl group bonded thereto, and the α-hydroxyalkylacrylic acid, in which a hydroxyalkyl group (and preferably a hydroxyalkyl group of 1 to 5 carbon atoms) is bonded to the carbon atom on the α-position.

As the cross-linking agent, an amino-based cross-linking agent such as a glycoluril having a methylol group or alkoxymethyl group is generally preferable, as it enables formation of a resist pattern with minimal swelling. The quantity of the cross-linking agent added is preferably within a range from 1 to 50 parts by weight per 100 parts by weight of the alkali-soluble resin.

When the chemically amplified resist composition is a positive resist composition, a base component that has acid dissociable, dissolution inhibiting groups and exhibits increased alkali solubility under the action of acid is used as the component (A').

The positive resist composition is alkali-insoluble prior to exposure, and when acid is generated from the component (B') upon exposure, the acid dissociable, dissolution inhibiting groups are dissociated by the action of the generated acid, and the component (A') becomes alkali-soluble. Accordingly, in the formation of a resist pattern, by conducting selective exposure of a resist film obtained by applying the positive resist composition onto a substrate, the exposed portions become alkali-soluble, whereas the unexposed portions remain alkali-insoluble, meaning alkali developing can then be used to remove only the exposed portions, thereby forming a resist pattern.

The acid dissociable, dissolution inhibiting group is a group that exhibits an alkali dissolution inhibiting effect that renders the entire component (A') alkali-insoluble prior to exposure, but then dissociates under the action of the acid generated from the acid generator (B') following exposure, causing the entire component (A') to change to an alkali-soluble state. There are no particular restrictions on the acid dissociable, dissolution inhibiting group, which may be selected appropriately from groups typically used within conventional chemically amplified positive resist compositions.

As the component (A') of the positive resist composition, a component (A'-1) and/or a component (A'-2) described below are particularly preferred. The hydrophilic group may also act as the acid dissociable, dissolution inhibiting group.

Component (A'-1): a resin having acid dissociable, dissolution inhibiting groups.

Component (A'-2): a low-molecular compound having an acid dissociable, dissolution inhibiting group.

Preferred embodiments of the component (A'-1) and the component (A'-2) are described below in more detail.

[Component (A'-1)]

As the component (A'-1), a resin containing a structural unit having a hydrophilic group and a structural unit having an acid dissociable, dissolution inhibiting group is preferred.

In this resin, the proportion of the structural unit having a hydrophilic group, relative to the combined total of all the structural units that constitute the resin, is preferably within a range from 20 to 80 mol %, more preferably from 20 to 70 mol %, and still more preferably from 20 to 60 mol %.

The proportion within the resin of the structural unit having an acid dissociable, dissolution inhibiting group, relative to the combined total of all the structural units that constitute the resin, is preferably within a range from 20 to 80 mol %, more preferably from 20 to 70 mol %, and still more preferably from 30 to 60 mol %.

The structural unit having a hydrophilic group is preferably a structural unit having a carboxyl group, alcoholic hydroxyl group or phenolic hydroxyl group, and is more preferably a unit derived from acrylic acid, methacrylic acid, an (α-lower alkyl) acrylate ester having an alcoholic hydroxyl group, or hydroxystyrene.

Specific examples of resins that can be used favorably as the component (A'-1) include novolak resins having a hydrophilic group and an acid dissociable, dissolution inhibiting group, hydroxystyrene-based resins, α-lower alkyl) acrylate ester resins, and copolymer resins that include a structural unit derived from hydroxystyrene and a structural unit derived from an (α-lower alkyl) acrylate ester.

In the present description, the term "(α-lower alkyl) acrylic acid refers to one or both of acrylic acid ($CH_2$=CH—COOH) and α-lower alkyl acrylic acid.

An α-lower alkyl acrylic acid refers to a compound in which the hydrogen atom bonded to the carbon atom that is bonded to the carbonyl group of the acrylic acid is substituted with a lower alkyl group. An "(α-lower alkyl) acrylate ester" is an ester derivative of the "α-lower alkyl) acrylic acid", and refers to one or both of the acrylate ester and the α-lower alkyl acrylate ester.

A "structural unit derived from an α-lower alkyl) acrylate ester" refers to a structural unit formed by cleavage of the ethylenic double bond of the (α-lower alkyl) acrylate ester, and hereafter, may also be referred to as an "(α-lower alkyl) acrylate structural unit". The term "(α-lower alkyl) acrylate" refers to one or both of the acrylate and the α-lower alkyl acrylate.

A "structural unit derived from hydroxystyrene" refers to a structural unit formed by cleavage of the ethylenic double bond of hydroxystyrene or an α-lower alkyl hydroxystyrene, and hereafter, may also be referred to as a "hydroxystyrene unit". An "α-lower alkyl hydroxystyrene" is a compound in which a lower alkyl group is bonded to the carbon atom to which the phenyl group is bonded.

In a "structural unit derived from an α-lower alkyl acrylate ester" and a "structural unit derived from an α-lower alkyl hydroxystyrene", the lower alkyl group bonded at the α-position is typically an alkyl group of 1 to 5 carbon atoms, is preferably a linear or branched alkyl group, and specific examples include a methyl group, ethyl group, propyl group, isopropyl group, n-butyl group, isobutyl group, tert-butyl group, pentyl group, isopentyl group and neopentyl group. From an industrial perspective, a methyl group is preferred.

Although there are no particular restrictions on preferred resin components for the component (A'-1), examples include resin components (hereafter also referred to as "component (A'-11)") containing a unit having a phenolic hydroxyl group such as a structural unit (a'1) described below, at least one structural unit having an acid dissociable, dissolution inhibiting group selected from the group consisting of structural units (a'2) and (a'3) described below, and an alkali-insoluble unit such as (a'4) described below which may be used where necessary.

In the component (A'-11), the action of the acid generated from the acid generator upon exposure causes bond cleavage within the structural unit (a'2) and/or structural unit (a'3), causing the resin that was initially insoluble in alkali developing solutions to develop increased alkali solubility. As a result, exposure and developing can be used to form a chemically amplified positive resist pattern.

—Structural Unit (a'1)

The structural unit (a'1) is a unit having a phenolic hydroxyl group, and is preferably a unit derived from hydroxystyrene, represented by General Formula (I') shown below.

[Formula 1]

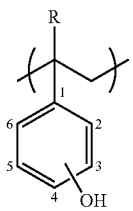

(I')

(wherein, R represents a hydrogen atom, an alkyl group of 1 to 5 carbon atoms, a halogen atom or a halo generated alkyl group.)

Specific examples of the alkyl group for R include lower linear or branched alkyl groups such as a methyl group, ethyl group, propyl group, isopropyl group, n-butyl group, isobutyl group, tert-butyl group, pentyl group, isopentyl group or neopentyl group. Examples of the halogen atom for R include a fluorine atom, chlorine atom, bromine atom or iodine atom. Examples of the halogenated alkyl group for R include groups in which some or all of the hydrogen atoms within an aforementioned alkyl group of 1 to 5 carbon atoms have been substituted with the above halogen atoms.

R is preferably either a hydrogen atom or a lower alkyl group, and from the viewpoint of industrial availability, is most preferably a hydrogen atom or a methyl group. This definition of R also applies below.

There are no particular restrictions on the bonding position of the —OH group to the benzene ring, although the position labeled 4 in the formula (the para position) is preferred.

From the viewpoint of forming a favorable pattern, the quantity of the structural unit (a'1) within the component (A'-11) is typically within a range from 40 to 80 mol %, and is preferably from 50 to 75 mol %. By ensuring that this quantity is at least 40 mol %, the solubility of the component (A'-11) in the alkali developing solution can be improved, and a favorable improvement in the pattern shape can also be obtained. Ensuring the quantity is not more than 80 mol % enables a favorable balance to be achieved with the other structural units.

Furthermore, in terms of forming a coating film on top of the pattern, the quantity of the structural unit (a'1) within the component (A'-11) is preferably at least 50 mol %, more preferably at least 60 mol %, and is most preferably 75 mol % or greater. Although there are no particular restrictions on the upper limit, quantities of not more than 80 mol % are preferred. If the quantity falls within the above range, then the presence of the phenolic hydroxyl groups enables a favorable coating film to be formed on top of the pattern, and a favorable pattern shape can also be obtained. Furthermore, the adhesion between the pattern and the coating film is also favorable.

—Structural Unit (a'2)

The structural unit (a'2) is a structural unit having an acid dissociable, dissolution inhibiting group, and is represented by General Formula (II') shown below.

[Formula 2]

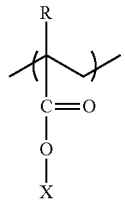

(II')

(wherein, R is as defined above for R in General Formula (I'), and X represents an acid dissociable, dissolution inhibiting group.)

Examples of the acid dissociable, dissolution inhibiting group X include alkyl groups having a tertiary carbon atom in which the tertiary carbon atom of that tertiary alkyl group is bonded to the ester group [—C(O)O—], as well as cyclic acetal groups such as a tetrahydropyranyl group and tetrahydrofuranyl group.

In addition to the groups described above, this type of acid dissociable, dissolution inhibiting group X may also use any of the groups typically used within chemically amplified positive resist compositions.

As the structural unit (a'2), units such as those represented by General Formula (III') shown below are preferred.

[Formula 3]

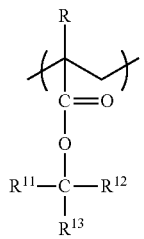

(III')

In this formula, R is as defined above for R in General Formula (I'), $R^{11}$, $R^{12}$ and $R^{13}$ each independently represents a lower alkyl group (which may be linear or branched, and preferably contains from 1 to 5 carbon atoms). Furthermore, of the groups $R^{11}$, $R^{12}$ and $R^{13}$, $R^{11}$ may represent a lower alkyl group, and $R^{12}$ and $R^{13}$ may be bonded together to form a monocyclic or polycyclic aliphatic cyclic group. The number of carbon atoms within the aliphatic cyclic group is preferably from 5 to 12.

Here, the term "aliphatic" defines a group or compound that has no aromaticity, and an "aliphatic cyclic group" refers to a monocyclic or polycyclic group that has no aromaticity.

In those cases where $R^{11}$, $R^{12}$ and $R^{13}$ do not include an aliphatic cyclic group, units in which $R^{11}$, $R^{12}$ and $R^{13}$ are all methyl groups are preferred.

In those cases where $R^{11}$, $R^{12}$ and $R^{13}$ do include an alicyclic group, then in those cases where the aliphatic cyclic group is a monocyclic aliphatic cyclic group, units having a cyclopentyl group or cyclohexyl group are preferred as the structural unit (a'2).

In those cases where the aliphatic cyclic group is a polycyclic aliphatic cyclic group, examples of preferred structural units (a'2) include those represented by General Formula (IV') shown below.

[Formula 4]

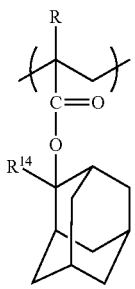

(IV')

[wherein, R is as defined above for R in General Formula (I'), and $R^{14}$ represents a lower alkyl group (which may be linear or branched, and preferably contains from 1 to 5 carbon atoms).]

Furthermore, as a structural unit having an acid dissociable, dissolution inhibiting group that includes a polycyclic aliphatic cyclic group, units represented by General Formula (V') shown below are preferred.

[Formula 5]

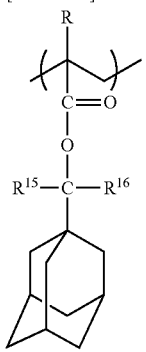

(V')

[wherein, R is as defined above for R in General Formula (I'), and $R^{15}$ and $R^{16}$ each independently represents a lower alkyl group (which may be linear or branched, and preferably contains from 1 to 5 carbon atoms).]

The quantity of the structural unit (a'2) within the component (A'-11) is typically within a range from 5 to 50 mol %, and is preferably from 10 to 40 mol %, and more preferably from 10 to 35 mol %.

—Structural Unit (a'3)

The structural unit (a'3) is a structural unit having an acid dissociable, dissolution inhibiting group, and is represented by General Formula (VI') shown below.

[Formula 6]

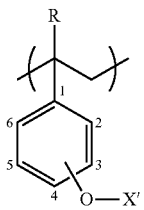

(VI')

(wherein, R is as defined above for R in General Formula (I'), and X' represents an acid dissociable, dissolution inhibiting group.)

Examples of the acid dissociable, dissolution inhibiting group X' include tertiary alkyloxycarbonyl groups such as a tert-butyloxycarbonyl group or tert-amyloxycarbonyl group; tertiary alkyloxycarbonylalkyl groups such as a tert-butyloxycarbonylmethyl group or tert-butyloxycarbonylethyl group; tertiary alkyl groups such as a tert-butyl group or tert-amyl group; cyclic acetal groups such as a tetrahydropyranyl group or tetrahydrofuranyl group; and alkoxyalkyl groups such as an ethoxyethyl group or methoxypropyl group.

Of these groups, a tert-butyloxycarbonyl group, tert-butyloxycarbonylmethyl group, tert-butyl group, tetrahydropyranyl group or ethoxyethyl group is preferred. In addition to the groups listed above, the acid dissociable, dissolution inhibiting group X' may also use other groups typically used in chemically amplified positive resist compositions.

In the general formula (IV'), there are no particular restrictions on the bonding position of the group (—OX') bonded to the benzene ring, although bonding at the position labeled 4 in the above formula (the para position) is preferred.

The quantity of the structural unit (a'3) within the component (A'-11) is typically within a range from 5 to 50 mol %, and is preferably from 10 to 40 mol %, and more preferably from 10 to 35 mol %.

—Structural Unit (a'4)

The structural unit (a'4) is an alkali-insoluble unit, and is represented by General Formula (VII') shown below.

[Formula 7]

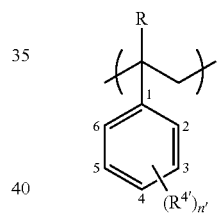

(VII')

(wherein, R is as defined above for R in General Formula (I'), $R^4$ represents a lower alkyl group, and n' represents either 0 or an integer from 1 to 3.)

The lower alkyl group for $R^4$ may be either a linear or branched group, and preferably contains from 1 to 5 carbon atoms.

n' is either 0 or an integer from 1 to 3, and is preferably 0.

The quantity of the structural unit (a'4) within the component (A'-11) is typically within a range from 1 to 40 mol %, and is preferably from 5 to 25 mol %. By ensuring this quantity is at least 1 mol %, the level of improvement in the shape (and particularly the improvement in thickness loss) is enhanced, whereas ensuring the quantity is not more than 40 mol % enables a favorable balance to be achieved with the other structural units.

The component (A'-11) must include the structural unit (a'1) and at least one structural unit selected from the group consisting of the structural unit (a'2) and the structural unit (a'3), and may also contain a structural unit (a'4). Furthermore, a copolymer containing all of the structural units may be used, or a mixture of a plurality of different polymers each containing at least one of the structural units may be used. Combinations of these two possibilities are also possible.

Furthermore, the component (A'-11) may also include other units besides the structural units (a'1), (a'2), (a'3) and (a'4) described above, although the structural units (a'1), (a'2), (a'3) and (a'4) preferably represent at least 80 mol %, more preferably at least 90 mol % (and most preferably 100 mol %) of the component (A'-11).

The use of "a single copolymer containing the structural units (a'1) and (a'3), or a mixture of two or more different copolymers of this type", or "a copolymer containing the structural units (a'1), (a'2) and (a'4), or a mixture of two or more different copolymers of this type", or a mixture of these two configurations offers a simple way of achieving the desired effects, and is therefore the most desirable. Furthermore, such a configuration is also preferred in terms of an improvement in the heat resistance.

A mixture of a polyhydroxystyrene protected with tertiary alkyloxycarbonyl groups and a polyhydroxystyrene protected with 1-alkoxyalkyl groups is particularly desirable. When mixing these two components, the mixing ratio (weight ratio) between the two polymers (namely, polyhydroxystyrene protected with tertiary alkyloxycarbonyl groups/polyhydroxystyrene protected with 1-alkoxyalkyl groups) is typically within a range from 1/9 to 9/1, is preferably from 2/8 to 8/2, and is more preferably from 2/8 to 5/5.

In terms of enabling formation of a pattern with a lower etching resistance, an example of a resin component that is suitable as the component (A'-1) but is different from the component (A'-11) described above is a resin component that includes an α-lower alkyl) acrylate ester resin, and resin components formed solely from an α-lower alkyl) acrylate ester resin are particularly desirable.

Of these (α-lower alkyl) acrylate ester resins (hereafter also referred to as "component (A'-12)"), a resin having a structural unit (a'5) derived from an α-lower alkyl) acrylate ester that contains an acid dissociable, dissolution inhibiting group is preferred. The α-lower alkyl group may be either a linear or branched group, and preferably contains from 1 to 5 carbon atoms.

The acid dissociable, dissolution inhibiting group of the structural unit (a'5) has an alkali dissolution inhibiting effect that renders the entire resin component alkali-insoluble prior to exposure, but then dissociates following exposure as a result of the action of the acid generated from the component (B'), causing the entire component (A'-12) to change to an alkali-soluble state.

Furthermore, in the α-lower alkyl) acrylate ester resin component, when the acid dissociable, dissolution inhibiting group within the structural unit (a'5) dissociates under the action of the acid generated from the component (B'), a carboxylic acid is generated. The presence of this generated carboxylic acid improves the adhesion with the coating film formed on top of the resist pattern.

As the acid dissociable, dissolution inhibiting group, for example, any of the multitude of groups that have been proposed for the resins used within resist compositions designed for use with ArF excimer lasers can be used. Generally, groups that form a cyclic or chain-like tertiary alkyl ester, or a cyclic or chain-like alkoxyalkyl group with the carboxyl group of the α-lower alkyl) acrylic acid are the most widely known.

Here, a "group that forms a tertiary alkyl ester" describes a group that forms an ester by substituting the hydrogen atom of the acrylic acid carboxyl group. In other words, a structure in which the tertiary carbon atom within a chain-like or cyclic tertiary alkyl group is bonded to the oxygen atom at the terminal of the carbonyloxy group [—C(O)—O—] of the acrylate ester. In this tertiary alkyl ester, the action of acid causes cleavage of the bond between the oxygen atom and the tertiary carbon atom.

A tertiary alkyl group refers to an alkyl group that includes a tertiary carbon atom.

Examples of groups that form a chain-like tertiary alkyl ester include a tert-butyl group and a tert-amyl group.

Examples of groups that form a cyclic tertiary alkyl ester include the same groups as those exemplified below in relation to the "acid dissociable, dissolution inhibiting group that contains an alicyclic group".

A "cyclic or chain-like alkoxyalkyl group" forms an ester by substitution with the hydrogen atom of a carboxyl group. In other words, a structure is formed in which the alkoxyalkyl group is bonded to the oxygen atom at the terminal of the carbonyloxy group [—C(O)—O—] of the acrylate ester. In this structure, the action of acid causes cleavage of the bond between the oxygen atom and the alkoxyalkyl group.

Examples of this type of cyclic or chain-like alkoxyalkyl group include a 1-methoxymethyl group, 1-ethoxyethyl group, 1-isopropoxyethyl group, 1-cyclohexyloxyethyl group, 2-adamantoxymethyl group, 1-methyladamantoxymethyl group, 4-oxo-2-adamantoxymethyl group, 1-adamantoxyethyl group, and 2-adamantoxyethyl group.

As the structural unit (a'5), structural units including an acid dissociable, dissolution inhibiting group that contains a cyclic group, and particularly an aliphatic cyclic group, are preferred.

Here, the terms "aliphatic" and "aliphatic cyclic group" are as defined above.

The aliphatic cyclic group may be either monocyclic or polycyclic, and can be selected appropriately, for example, from the multitude of groups proposed for use within ArF resists and the like. From the viewpoint of ensuring favorable etching resistance, a polycyclic alicyclic group is preferred. Furthermore, the alicyclic group is preferably a hydrocarbon group, and is even more preferably a saturated hydrocarbon group (an alicyclic group).

Examples of suitable monocyclic alicyclic groups include groups in which one hydrogen atom has been removed from a cycloalkane. Examples of suitable polycyclic alicyclic groups include groups in which one hydrogen atom has been removed from a bicycloalkane, tricycloalkane or tetracycloalkane or the like.

Specifically, examples of suitable monocyclic alicyclic groups include a cyclopentyl group or cyclohexyl group. Examples of suitable polycyclic alicyclic groups include groups in which one hydrogen atom has been removed from a polycycloalkane such as adamantane, norbornane, isobornane, tricyclodecane or tetracyclododecane.

Of these groups, an adamantyl group in which one hydrogen atom has been removed from adamantane, a norbornyl group in which one hydrogen atom has been removed from norbornane, a tricyclodecanyl group in which one hydrogen atom has been removed from tricyclodecane, and a tetracyclododecanyl group in which one hydrogen atom has been removed from tetracyclododecane are preferred industrially.

More specifically, the structural unit (a'5) is preferably at least one unit selected from General Formulas (I") to (III") shown below.

Furthermore, the structural unit (a'5) is preferably a unit derived from an α-lower alkyl) acrylate ester that has an aforementioned cyclic alkoxyalkyl group at the ester portion, and more specifically, is preferably at least one structural unit selected from amongst units derived from an aliphatic polycyclic alkyloxy lower alkyl α-lower alkyl) acrylate ester that may contain a substituent group, such as a 2-adamantoxymethyl group, 1-methyladamantoxymethyl group, 4-oxo-2-adamantoxymethyl group, 1-adamantoxyethyl group or 2-adamantoxyethyl group.

[Formula 8]

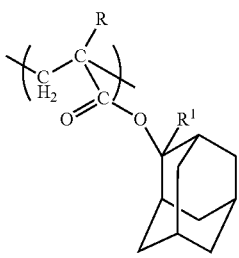
(I″)

[wherein, R is as defined above for R in General Formula (I′), and $R^1$ represents a lower alkyl group.]

[Formula 9]

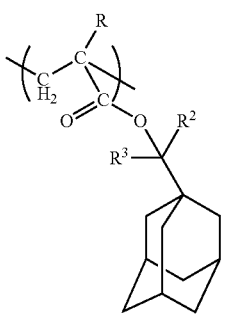
(II″)

[wherein, R is as defined above for R in General Formula (I′), and $R^2$ and $R^3$ each independently represents a lower alkyl group.]

[Formula 10]

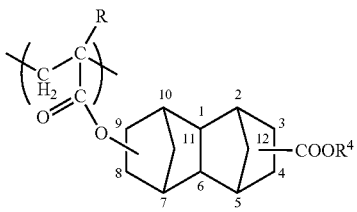
(III″)

[wherein, R is as defined above for R in General Formula (I′), and $R^4$ represents a tertiary alkyl group.]

In General Formulas (I″) to (III″), the hydrogen atom or lower alkyl group represented by R is the same as that described above in relation to the hydrogen atom or lower alkyl group bonded to the α-position of an acrylate ester.

The lower alkyl group for $R^1$ is preferably a linear or branched alkyl group of 1 to 5 carbon atoms, and specific examples include a methyl group, ethyl group, propyl group, isopropyl group, n-butyl group, isobutyl group, pentyl group, isopentyl group or neopentyl group. Of these, a methyl group or ethyl group is preferred from the viewpoint of industrial availability.

The lower alkyl groups of $R^2$ and $R^3$ each preferably independently represents a linear or branched alkyl group of 1 to 5 carbon atoms. Of the various possibilities, those cases in which $R^2$ and $R^3$ are both methyl groups are preferred industrially. A structural unit derived from 2-(1-adamantyl)-2-propyl acrylate is a specific example.

Furthermore, $R^4$ is a chain-like tertiary alkyl group or a cyclic tertiary alkyl group. Examples of chain-like tertiary alkyl groups include a tert-butyl group or tert-amyl group, although a tert-butyl group is preferred industrially.

Examples of cyclic tertiary alkyl groups include the same groups as those exemplified above in relation to the "acid dissociable, dissolution inhibiting group that contains an aliphatic cyclic group", and specific examples include a 2-methyl-2-adamantyl group, 2-ethyl-2-adamantyl group, 2-(1-adamantyl)-2-propyl group, 1-ethylcyclohexyl group, 1-ethylcyclopentyl group, 1-methylcyclohexyl group and 1-methylcyclopentyl group.

Furthermore, the group —COOR$^4$ may be bonded to either position 3 or 4 of the tetracyclododecanyl group shown in the formula, although the bonding position cannot be further specified. Furthermore, in a similar manner, the carboxyl group residue of the acrylate structural unit may be bonded to either position 8 or 9 within the formula.

The structural unit (a′5) may use either a single structural unit, or a combination of two or more different structural units.

The proportion of the structural unit (a′5) within the component (A′-12), relative to the combined total of all the structural units that constitute the component (A′-12), is preferably within a range from 20 to 60 mol %, more preferably from 30 to 50 mol %, and is most preferably from 35 to 45 mol %. By ensuring that this proportion is at least as large as the lower limit of the above range, a favorable pattern can be obtained, whereas ensuring that the proportion is no greater than the upper limit enables a favorable balance to be achieved with the other structural units.

The component (A′-12) preferably also includes, in addition to the structural unit (a′5) described above, a structural unit (a′6) derived from an acrylate ester that contains a lactone ring. The structural unit (a′6) is effective in improving the adhesion of the resist film to the substrate, and enhancing the hydrophilicity of the resin relative to the developing solution. Furthermore, the structural unit (a′6) also enables the formation of a coating film that exhibits superior adhesion to the pattern.

In the structural unit (a′6), a lower alkyl group or a hydrogen atom is bonded to the α-position carbon atom. The lower alkyl group bonded to the α-position carbon atom is the same as that described above for the structural unit (a′5), and is preferably a methyl group.

Examples of the structural unit (a′6) include structural units in which a monocyclic group composed of a lactone ring or a polycyclic cyclic group that includes a lactone ring is bonded to the ester side-chain portion of an acrylate ester.

The term "lactone ring" refers to a single ring containing a —O—C(O)— structure, and this ring is counted as the first ring. Accordingly, in this description, the case in which the only ring structure is the lactone ring is referred to as a monocyclic group, and groups containing other ring structures are described as polycyclic groups regardless of the structure of the other rings.

Examples of the structural unit (a′6) include units having a monocyclic group in which one hydrogen atom has been removed from γ-butyrolactone, and units having a polycyclic group in which one hydrogen atom has been removed from a lactone ring-containing bicycloalkane.

Specifically, the structural unit (a′6) is preferably at least one unit selected from general formulas (IV″) through (VII″) shown below.

[Formula 11]

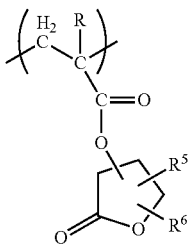
(IV''')

[wherein, R is as defined above for R in General Formula (I'), and $R^5$ and $R^6$ each independently represents a hydrogen atom or a lower alkyl group.]

[Formula 12]

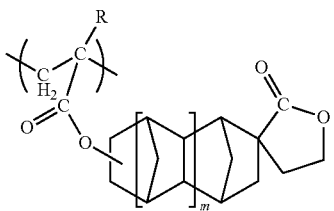
(V''')

[wherein, R is as defined above for R in General Formula (I'), and m represents either 0 or 1.]

[Formula 13]

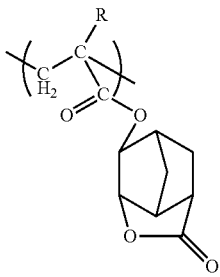
(VI''')

[wherein, R is as defined above for R in General Formula (I').]

[Formula 14]

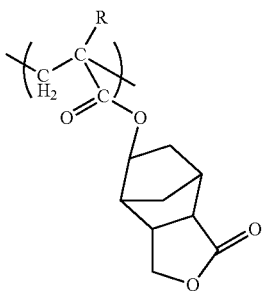
(VII''')

[wherein, R is as defined above for R in General Formula (I').]

In Formula (IV'''), $R^5$ and $R^6$ each independently represents a hydrogen atom or a lower alkyl group, and preferably represents a hydrogen atom. The lower alkyl groups for $R^5$ and $R^6$ are preferably linear or branched alkyl groups of 1 to 5 carbon atoms, and specific examples include a methyl group, ethyl group, propyl group, isopropyl group, n-butyl group, isobutyl group, tert-butyl group, pentyl group, isopentyl group or neopentyl group. A methyl group is preferred industrially.

Furthermore, amongst the structural units represented by General Formulas (IV''') through (VII'''), structural units represented by General Formula (IV''') are low cost and therefore preferred industrially, and of the possible structural units represented by Formula (IV'''), α-methacryloyloxy-γ-butyrolactone, in which R is a methyl group, $R^5$ and $R^6$ are both hydrogen atoms, and the position of the ester linkage between the methacrylate ester and the γ-butyrolactone is at the α-position on the lactone ring, is the most desirable.

The structural unit (a'6) may use either a single structural unit, or a combination of two or more different structural units.

The proportion of the structural unit (a'6) within the component (A'-12), relative to the combined total of all the structural units that constitute the component (A'-12), is preferably within a range from 20 to 60 mol %, more preferably from 20 to 50 mol %, and is most preferably from 30 to 45 mol %. Ensuring that this proportion is at least as large as the lower limit of the above range improves the lithography properties, whereas ensuring that the proportion is no greater than the upper limit enables a favorable balance to be achieved with the other structural units.

The component (A'-12) preferably also includes, either in addition to the structural unit (a'5) described above or in addition to the structural units (a'5) and (a'6), a structural unit (a'7) derived from an acrylate ester that contains a polar group-containing polycyclic group.

Including the structural unit (a'7) increases the hydrophilicity of the entire component (A'-12), thereby improving the affinity with the developing solution, improving the alkali solubility within the exposed portions of the resist, and contributing to an improvement in the resolution. Furthermore, the structural unit (a'7) also enables the formation of a coating film that exhibits superior adhesion to the pattern.

In the structural unit (a'7), a lower alkyl group or a hydrogen atom is bonded to the α-position carbon atom. The lower alkyl group bonded to the α-position carbon atom is the same as that described above for the structural unit (a'5), and is preferably a methyl group.

Examples of the polar group include a hydroxyl group, cyano group, carboxyl group or amino group or the like, although a hydroxyl group is particularly preferred.

Examples of the polycyclic group include polycyclic groups selected from amongst the aliphatic cyclic groups exemplified above in relation to the "acid dissociable, dissolution inhibiting group that contains an aliphatic cyclic group" within the aforementioned structural unit (a'5).

The structural unit (a'7) is preferably at least one unit selected from General Formulas (VIII''') and (IX''') shown below.

[Formula 15]

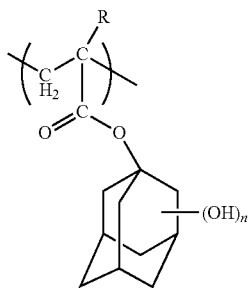

(VIII″)

[wherein, R is as defined above for R in General Formula (I'), and n represents an integer from 1 to 3.]

In Formula (VIII″), R is as described above for R in General Formula (I').

Of these units, structural units in which n is 1, and the hydroxyl group is bonded to the 3rd position of the adamantyl group are preferred.

[Formula 16]

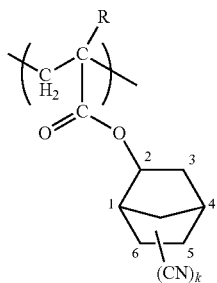

(IX″)

[wherein, R is as defined above for R in General Formula (I'), and k represents an integer from 1 to 3.]

Of these units, structural units in which k is 1 are preferred. Furthermore, the cyano group is preferably bonded to the 5th or 6th position of the norbornyl group.

The structural unit (a'7) may use either a single structural unit, or a combination of two or more different structural units.

The proportion of the structural unit (a'7) within the component (A'-12), relative to the combined total of all the structural units that constitute the component (A'-12), is preferably within a range from 10 to 50 mol %, more preferably from 15 to 40 mol %, and is most preferably from 20 to 35 mol %. Ensuring that this proportion is at least as large as the lower limit of the above range improves the lithography properties, whereas ensuring that the proportion is no greater than the upper limit enables a favorable balance to be achieved with the other structural units.

In the component (A'-12), the combined total of the structural units (a'5) through (a'7), relative to the combined total of all the structural units, is preferably within a range from 70 to 100 mol %, and is more preferably from 80 to 100 mol %.

The component (A'-12) may also include a structural unit (a'8) besides the aforementioned structural units (a'5) through (a'7).

There are no particular restrictions on the structural unit (a'8), which may be any other structural unit that cannot be classified as one of the above structural units (a'5) through (a'7).

For example, structural units that contain a polycyclic aliphatic hydrocarbon group and are derived from an (α-lower alkyl) acrylate ester are preferred. Suitable examples of the polycyclic aliphatic hydrocarbon group include polycyclic groups selected appropriately from amongst the aliphatic cyclic groups exemplified above in relation to the "acid dissociable, dissolution inhibiting group that contains an aliphatic cyclic group". In terms of factors such as industrial availability, at least one group selected from amongst a tricyclodecanyl group, adamantyl group, tetracyclododecanyl group, norbornyl group and isobornyl group is particularly preferred. As the structural unit (a'8), a non-acid dissociable group is the most desirable.

Specific examples of the structural unit (a'8) include units of the structures (X″) to (XII″) shown below.

[Formula 17]

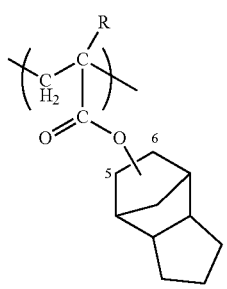

(X″)

(wherein, R is as defined above for R in General Formula (I').)

[Formula 18]

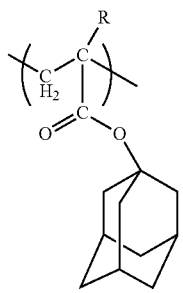

(XI″)

(wherein, R is as defined above for R in General Formula (I').)

[Formula 19]

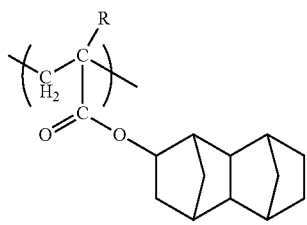

(XII″)

(wherein, R is as defined above for R in General Formula (I').)

In those cases where a structural unit (a' 8) is included, the proportion of the structural unit (a'8) within component (A'-

12), relative to the combined total of all the structural units that constitute the component (A'-12), is preferably within a range from 1 to 25 mol %, and is more preferably from 5 to 20 mol %.

The component (A'-12) is preferably a copolymer that includes at least the structural units (a'5), (a'6), and (a'7). Examples of such copolymers include copolymers formed solely from the structural units (a'5), (a'6) and (a'7), and copolymers formed from the structural units (a'5), (a'6), (a'7) and (a'8).

The component (A'-1) can be obtained by conducting a polymerization, using a conventional method, of the monomers corresponding with each of the structural units. For example, the component (A'-1) can be obtained by conducting a conventional radical polymerization or the like of the monomers corresponding with each of the structural units, using a radical polymerization initiator such as azobisisobutyronitrile (AIBN).

The weight average molecular weight (the polystyrene equivalent weight average molecular weight determined by gel permeation chromatography, this also applies below) of the component (A'-1) is preferably not more than 30,000, more preferably not more than 20,000, and still more preferably 12,000 or lower. The lower limit for this range is typically 2,000, although from the viewpoints of inhibiting pattern collapse and achieving a favorable improvement in resolution and the like, the weight average molecular weight is preferably at least 4,000, and more preferably 5,000 or greater.

[Component (A'-2)]

As the component (A'-2), a low-molecular compound that has a molecular weight of at least 500 but not more than 2,000, contains a hydrophilic group, and also contains an acid dissociable, dissolution inhibiting group such as the groups X and X' described above in relation to the component (A'-1) is preferred. Specific examples include compounds containing a plurality of phenol structures in which a portion of the hydroxyl group hydrogen atoms have been substituted with the acid dissociable, dissolution inhibiting groups X or X'.

Preferred examples of the component (A'-2) include low molecular weight phenol compounds in which a portion of the hydroxyl group hydrogen atoms have been substituted with the aforementioned acid dissociable, dissolution inhibiting groups. These types of compounds are known, for example, as sensitizers or heat resistance improvers for use in non-chemically amplified g-line or i-line resists, and any of these compounds may be used.

Specific examples of these low molecular weight phenol compounds include those compounds listed below.

Namely, examples include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Of course, this is not a restrictive list.

Similarly, there are no particular restrictions on the acid dissociable, dissolution inhibiting group, and suitable examples include the acid dissociable, dissolution inhibiting groups X and X' described above.

<Component (B')>

As the component (B), known materials used as acid generators in conventional chemically amplified resists can be used. Examples of these types of acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzylsulfonate-based acid generators, iminosulfonate-based acid generators, and disulfone-based acid generators.

Specific examples of onium salt-based acid generators include diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate and triphenylsulfonium nonafluorobutanesulfonate. Of these, onium salts with a fluorinated alkylsulfonate ion as the anion are preferred.

Specific examples of oxime sulfonate compounds include α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Specific examples of diazomethane-based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

As the component (B'), either a single acid generator may be used alone, or a combination of two or more different acid generators may be used.

The quantity used of the component (B') is typically within a range from 1 to 20 parts by weight, and preferably from 2 to 10 parts by weight, per 100 parts by weight of the component (A'). Ensuring that the quantity is at least as large as the lower limit of the above range enables favorable pattern formation, whereas ensuring that the proportion is no greater than the upper limit facilitates the production of a uniform solution, and enables favorable storage stability to be achieved.

<Optional Components>

In the chemically amplified resist composition, in order to improve the pattern shape and the post exposure stability of the latent image formed by the pattern-wise exposure of the resist layer, a nitrogen-containing organic compound (D') (hereafter also referred to as "component (D')") may be added as an optional component.

A multitude of these components (D') have already been proposed, and any of these known compounds may be used, although an amine, and in particular a secondary lower aliphatic amine or tertiary lower aliphatic amine, is preferred.

Here, a "lower aliphatic amine" refers to an alkyl or alkyl alcohol amine of not more than 5 carbon atoms. Specific examples of these secondary and tertiary amines include trimethylamine, diethylamine, triethylamine, di-n-propylamine, tri-n-propylamine, tripentylamine, diethanolamine, triethanolamine and triisopropanolamine, and of these, tertiary alkanolamines such as triethanolamine and triisopropanolamine are particularly preferred.

These compounds may be used either alone, or in combinations of two or more different compounds.

The component (D') is typically used in a quantity within a range from 0.01 to 5.0 parts by weight per 100 parts by weight of the component (A').

Furthermore, in the chemically amplified resist composition, in order to prevent any deterioration in sensitivity caused by the addition of the above component (D') and improve the resist pattern shape and the post exposure stability of the latent image formed by the pattern-wise exposure of the resist layer, an organic carboxylic acid, or a phosphorus oxo acid or derivative thereof (E') (hereafter also referred to as "component (E')") may also be added as another optional component. The component (D') and the component (E') can be used in combination, or either one can also be used alone.

As the organic carboxylic acid, compounds such as malonic acid, citric acid, malic acid, succinic acid, benzoic acid and salicylic acid are preferred.

Examples of the phosphorus oxo acid or derivative thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E') is typically used in a quantity within a range from 0.01 to 5.0 parts by weight per 100 parts by weight of the component (A').

If desired, other miscible additives can also be added to the chemically amplified resist composition. Examples of such miscible additives include additive resins for improving the performance of the applied film of the resist composition, surfactants for improving the coating properties, dissolution inhibitors, plasticizers, stabilizers, colorants and halation prevention agents.

The chemically amplified resist composition can be prepared by dissolving the materials for the resist composition in an organic solvent (S') (hereafter, also referred to as "component (S')").

The component (S') may be any organic solvent capable of dissolving the respective components to generate a uniform solution, and one or more types of organic solvent can be appropriately selected from those solvents that have conventionally been known as solvents for resist compositions.

Specific examples of the solvent include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, propylene glycol monomethyl ether acetate (PGMEA), dipropylene glycol, and the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate. Of these, PGMEA, EL, and propylene glycol monomethyl ether (PGME) are preferred.

These organic solvents may be used either alone, or as a mixed solvent of two or more different solvents.

There are no particular restrictions on the quantity used of the component (S'), and a quantity that produces a liquid having a concentration that is suitable for application to a support is used.

[Method of Forming Resist Pattern Using Lithography Process]

In those cases where an aforementioned template-forming material is used, a lithography process is preferably used for forming the template, as it enables the formation of a microscopic pattern with a high degree of precision.

Formation of the template using a lithography process can be conducted using a conventional procedure, and for example in those cases where a chemically amplified resist composition is used, can be conducted in the manner described below.

First, the resist composition is applied onto a substrate using a spinner or the like, and a prebake (Post Applied Bake (PAB)) is conducted under temperature conditions of 80 to 150° C. for 40 to 120 seconds, and preferably for 60 to 90 seconds, to form a resist film. Although there are no particular restrictions on the thickness of the resist film, the thickness is typically fixed within a range from several tens of nm to several μm, and is preferably from 100 to 800 nm.

Subsequently, following selective exposure of the resist film using a commercially available exposure apparatus or the like, PEB (Post Exposure Baking) is conducted under temperature conditions of 80 to 150° C. for 40 to 120 seconds, and preferably for 60 to 90 seconds. Subsequently, a developing treatment is conducted using an alkali developing solution such as a 0.1 to 10% by weight aqueous solution of tetramethylammonium hydroxide. In this manner, a template (resist pattern) can be formed.

There are no particular restrictions on the exposure radiation source, which may be selected appropriately in accordance with the resist composition that is used. Specifically, the exposure radiation source is preferably selected in accordance with factors such as the size of the template being formed, and the nature of the template-forming material used. Although there are no particular restrictions on the exposure source, radiation within a range from far ultraviolet radiation of 300 nm or less through to extreme ultraviolet radiation of several nm, or radiation in the X-ray region is typically used.

For example, KrF excimer lasers, ArF excimer lasers, electron beams, EUV (Extreme Ultraviolet, wavelength: 13.5 μm) and X-rays and the like can be used. In those cases where a chemically amplified resist composition described above is used, a KrF excimer laser, ArF excimer laser, $F_2$ excimer laser, EUV (extreme ultraviolet), VUV (vacuum ultraviolet), electron beam, X-ray or soft X-ray is preferred. On the other hand, when a radiation-sensitive composition other than the aforementioned chemically amplified composition is used, the use of an electron beam enables the formation of a very fine pattern of not more than 200 nm, and is consequently preferred.

The treatment conditions for forming a template via a lithography process are not restricted to the conditions described above, and may be determined appropriately in accordance with the composition of the template-forming material.

Further, the method of forming the template is not restricted to lithography processes. For example, an imprint process (a process that uses a microscopic structure prepared by pressing a substrate that has been microfabricated in advance against another substrate, thereby transferring the microfabricated structure) can be used. An imprint process can be used regardless of whether or not the template-forming material exhibits radiation sensitivity.

[Activation Treatment]

In the present invention, prior to formation of the coating film on the template surface, the surface of the template is preferably subjected to an activation treatment. By conducting an activation treatment, the hydrophilicity of the template surface increases (activation), meaning the coating film can not only be formed on the surface with a high density and superior adhesion, but can also be formed with a shape that represents a highly precise reproduction or transferal of the template shape.

Conventional methods can be used for conducting the activation treatment, and examples include oxygen plasma treatments, ozone oxidation treatments, acid-alkali treatments and chemical modification treatments. Of these, an oxygen plasma treatment is preferred as the treatment time is short and the treatment is relatively simple. Furthermore, by conducting an oxygen plasma treatment, not only can the template surface be activated, but by controlling the treatment conditions, the height of the template, and therefore the height of the structure that is formed, can also be controlled. For example, the longer the oxygen plasma treatment time, the lower the template height becomes, resulting in a more microscopic structure.

When an oxygen plasma treatment is used, the pressure during the oxygen plasma treatment is preferably within a range from 1.33 to 66.5 Pa (10 to 500 mtorr), and more preferably from 13.3 to 26.6 Pa (100 to 200 mtorr). Further, the plasma output during the oxygen plasma treatment is preferably within a range from 5 to 500 W, and more preferably from 5 to 50 W. Furthermore, the treatment time for the oxygen plasma treatment is preferably within a range from 1 to 30 seconds, and more preferably from 2 to 5 seconds. The temperature during the oxygen plasma treatment is preferably within a range from −30 to 300° C., more preferably from 0 to 100° C., and is most preferably set to room temperature (5 to 40° C.). There are no particular restrictions on the apparatus used for the oxygen plasma treatment, and for example, an apparatus such as a PE-2000 Plasma Etcher (a product name) manufactured by South Bay Technology, USA can be used.

As the method of forming the coating film composed of a metal layer or a metal oxide layer on the surface of the template, conventional metal layer formation methods or metal oxide layer formation methods may be used. In those cases where a metal oxide layer is formed as the coating film, in the present invention, the metal oxide layer is preferably formed using a metal oxide layer-forming material obtained by dissolving, within an organic solvent (S), a metal compound (W) that is capable of generating a hydroxyl group by hydrolysis. Furthermore, in those cases where a metal layer is used as the coating film, in the present invention, the metal layer is preferably formed by electroless plating.

[Metal Oxide Layer-Forming Material]
(Metal Compound (W))

The metal compound (W) is a compound that is capable of generating a hydroxyl group by hydrolysis.

When a metal oxide layer-forming material containing the metal compound (W) is applied to the template surface, or is applied to the surface and then coated with water, and preferably deionized water, the metal compound (W) reacts with the moisture in the atmosphere or the applied water and generates hydroxyl groups by hydrolysis, even at low temperatures (for example, approximately room temperature). Subsequently, the generated hydroxyl groups undergo a dehydration-condensation, thereby binding a plurality of molecules of the metal compound (W) together, and forming a dense metal oxide layer with a high density. This type of metal oxide layer contains a high density of metal oxide, and consequently exhibits excellent etching resistance. Furthermore, because coating can be conducted at a low temperature, the shape of the coated template is not damaged.

Moreover, when the template is formed from an organic material that includes reactive groups such as carboxyl groups or hydroxyl groups, these reactive groups at the template surface and the hydroxyl groups generated from the metal compound (W) react (via dehydration-condensation or adsorption or the like), thus forming a strongly bound metal oxide layer on the template surface.

As the metal compound (W), for example, metal compounds having a functional group that can generate a hydroxyl group upon hydrolysis can be used.

This functional group is preferably bonded directly to the metal atom.

The number of these functional groups is preferably at least two, is more preferably within a range from 2 to 4, and is most preferably 4, for each metal atom. Ensuring that the compound contains at least two of these functional groups means that the hydroxyl groups generated by hydrolysis readily undergo dehydration-condensation, thereby binding a plurality of molecules of the metal compound (W) together in a continuous manner to form a strong metal oxide layer.

Examples of functional groups that can generate a hydroxyl group upon hydrolysis include alkoxy groups, an isocyanate group, and a carbonyl group. Furthermore, because halogen atoms also have a similar function, halogen atoms are also included within the functional groups of the present invention.

Examples of the alkoxy groups include linear or branched lower alkoxy groups of 1 to 5 carbon atoms such as a methoxy group (—O-Me), ethoxy group (—O-Et), n-propoxy group (—O-nPr), isopropoxy group (—O-iPr), and n-butoxy group (—O-nBu).

Examples of the halogen atoms include a chlorine atom, fluorine atom, bromine atom and iodine atom, although of these, a chlorine atom is preferred.

Of the above groups, alkoxy groups and isocyanate groups are preferred because in those cases where the metal oxide layer-forming material is applied to a pattern to form a metal oxide layer, if reactive groups such as carboxyl groups or hydroxyl groups exist at the template surface, then the alkoxy groups and isocyanate groups undergo a condensation reaction with these reactive groups. As a result, the hydroxyl groups formed following hydrolysis and the reactive groups at the template surface undergo a condensation reaction, thereby binding the coating film and the template surface powerfully together.

Of the above groups, carbonyl groups and halogen atoms are preferred because in those cases where the metal oxide layer-forming material is applied to the template to form a coating film, if reactive groups such as carboxyl groups or hydroxyl groups exist at the template surface, then the carbonyl groups and halogen atoms adsorb to these reactive groups. As a result, the hydroxyl groups formed following hydrolysis and the reactive groups at the surface undergo adsorption, thereby binding the coating film and the template surface powerfully together.

Of the above groups, isocyanate groups and halogen atoms (and particularly chlorine atoms) are preferred, as they exhibit a high level of activity and can readily form a coating film even without conducting a heat treatment, and of these, isocyanate groups are particularly desirable.

In the present invention, the metal that constitutes the metal compound (W) includes not only typical metals, but also boron, silicon, germanium, antimony, selenium, and tellurium and the like.

Examples of preferred metals for forming the metal compound (W) include titanium, zirconium, aluminum, niobium, silicon, boron, lanthanide, yttrium, barium, cobalt, iron, zirconium and tantalum, and of these, titanium and silicon are particularly preferred, and silicon is the most desirable.

Furthermore, the number of metal atoms within the metal compound (W) may be either one, or two or greater, although one atom is preferred.

The metal compound (W) may also include other atoms or organic groups besides the "functional group that can generate a hydroxyl group by hydrolysis" described above. Other atoms include, for example, a hydrogen atom. Other organic groups include, for example, alkyl groups (and preferably lower alkyl groups of 1 to 5 carbon atoms), and an ethyl group or methyl group is preferred.

In the present description and claims, unless stated otherwise, the term "alkyl group" includes linear, branched and cyclic monovalent saturated hydrocarbon groups.

Examples of the metal compound (W) include the compounds listed below. Examples of metal compounds containing an alkoxy group (hereafter also referred to as "metal alkoxides") include the compounds listed below.

For example, metal alkoxide compounds of metals other than rare earth metals, such as titanium butoxide (Ti(O-nBu)$_4$), zirconium propoxide (Zr(O-nPr)$_4$), aluminum butoxide (Al(O-nBu)$_3$), niobium butoxide (Nb(O-nBu)$_5$), silicon tetramethoxide (Si(O-Me)$_4$), and boron ethoxide (B(O-Et)$_3$);

metal alkoxide compounds of rare earth metals, such as lanthanide isopropoxide (Ln(O-iPr)$_3$) and yttrium isopropoxide (Y(O-iPr)$_3$);

double alkoxide compounds such as barium titanium alkoxide (BaTi(OR$^{60}$)$_X$) (wherein, R$^{60}$ represents a lower alkyl group of 1 to 5 carbon atoms, and X represents an integer from 2 to 4);

metal alkoxide compounds containing two or more alkoxy groups and an organic group other than an alkoxy group, such as methyltrimethoxysilane (MeSi(O-Me)$_3$) and diethyldiethoxysilane (Et$_2$Si(O-Et)$_2$); and metal alkoxide compounds containing a ligand such as acetylacetone, and two or more alkoxy groups.

Furthermore, microparticles of alkoxide sols or alkoxide gels obtained by adding a small quantity of water to one of the above metal alkoxides to effect a partial hydrolysis and condensation can also be used.

Moreover, binuclear or cluster-type alkoxide compounds containing a plurality of metal atoms or a plurality of different metal elements, such as titanium butoxide tetramer (C$_4$H$_9$O[Ti(OC$_4$H$_9$)$_2$O]$_4$C$_4$H$_9$), and polymers based on metal alkoxide compounds that have undergone one-dimensional cross-linking via oxygen atoms, are also included within the above metal alkoxides.

Examples of metal compounds containing an isocyanate group include compounds containing two or more isocyanate groups, as represented by the general formula M(NCO)$_X$ (wherein, M represents a metal atom, and X represents an integer from 2 to 4).

Specific examples include tetraisocyanatosilane (Si(NCO)$_4$), titanium tetraisocyanate (Ti(NCO)$_4$), zirconium tetraisocyanate (Zr(NCO)$_4$), and aluminum triisocyanate (Al(NCO)$_3$).

Examples of metal compounds containing a halogen atom include halogenated metal compounds containing two or more (and preferably from 2 to 4) halogen atoms, as represented by the general formula M(X$_1$)$_n$ (wherein, M represents a metal atom, X$_1$ represents one type of atom selected from amongst a fluorine atom, chlorine atom, bromine atom and iodine atom, and n represents an integer from 2 to 4).

The compound containing a halogen atom may also be a metal complex.

Specific examples include tetrachlorotitanium (TiCl$_4$) and tetrachlorosilane (SiCl$_4$). An example of a metal complex is cobalt chloride (CoCl$_2$).

Examples of metal compounds containing a carbonyl group include metal carbonyl compounds such as titanium oxoacetylacetate (TiO(CH$_3$COCH$_2$COO)$_2$) and pentacarbonyl iron (Fe(CO)$_5$), as well as polynuclear clusters of these compounds.

Amongst the above compounds, silicon compounds containing two or more (and preferably from 2 to 4) isocyanate groups and/or halogen atoms are particularly preferred, as they exhibit a high level of activity, and can readily form a metal oxide layer with superior etching resistance even without conducting a heat treatment.

The number of silicon atoms within each molecule of this silicon compound may be either one, or two or greater, although one atom is preferred. Of these compounds, compounds represented by General Formula (w-1) shown below are preferred.

$$SiW_a \qquad \text{(w-1)}$$

[wherein, a represents an integer from 2 to 4, W represents an isocyanate group (an NCO group) or a halogen atom, and the plurality of W groups may be either the same or mutually different.]

In Formula (w-1), a represents an integer from 2 to 4, and is most preferably 4.

W represents an isocyanate group or a halogen atom, and examples of the halogen atom include the same atoms listed above, although a chlorine atom is preferred. Of these, an isocyanate group is particularly preferred.

The metal compound (W) may use either a single compound, or a mixture of two or more different compounds.

(Solvent (S))

As the solvent (S), any solvent capable of dissolving the metal compound (W) may be used, and although there are no particular restrictions, a solvent (S1) that has no functional groups that undergo reaction with the metal compound (W) is preferred.

As the solvent (S1), any solvent that has no functional groups that undergo reaction with the metal compound (W) but is capable of dissolving the metal compound (W) may be used, and this solvent may be selected from conventional organic solvents.

Example of functional groups that react with the metal compound (W) include groups containing a carbon-carbon double bond such as a vinyl group, as well as a hydroxyl group, carboxyl group and halogen atoms. Provided the solvent (S1) contains none of these functional groups, the metal compound (W) exists stably within the solvent (S), yielding excellent metal oxide layer forming capabilities. Further, the coating selectivity during formation of the metal oxide layer also improves. In other words, the aforementioned template-forming material and the material used for forming an organic film in Step (3) described below typically use organic compounds that include a comparatively large quantity of functional groups such as hydroxyl groups that react with the metal compound (W), and these functional groups exist at the surface of the template formed using the template-forming material and the surface of the organic film. As a result, when the metal oxide layer-forming material containing the dissolved metal compound (W) is applied to the template or the organic film during formation of a coating film, the metal compound (W) adsorbs comparatively strongly to the template or organic film surface via chemical adsorption. On the other hand, although the metal oxide layer-forming material also contacts the substrate surface, because no functional groups that react with the metal compound (W) exist at the substrate surface, or if they do exist are minimal in number, chemical adsorption is far less likely to occur between the metal compound (W) and the substrate surface. Accordingly, the metal oxide layer forms preferentially on the surface of the template or organic film rather than the template surface (namely, the coating selectivity improves). Particularly in those cases where following application of the metal oxide layer-forming material to the template or organic film, the material is washed (rinsed) with an organic solvent, the metal compound (W) chemically adsorbed to the surface of the template or organic film is retained uniformly on the surface, whereas the metal compound (W) on the substrate surface is washed away. As a result, a uniform metal oxide layer can be formed on the surface of the template or the organic film with an even greater degree of selectivity.

Moreover, as a result of the chemical adsorption, the metal oxide layer formed on the surface of the template or organic film exhibits powerful adhesion to the surface, and is resistant to removal during etching.

In this description, the term "chemical adsorption" describes the state where chemical bonds (covalent bonds, hydrogen bonds or coordination bonds or the like) or electrostatic bonds (such as ion bonds) are formed between the functional groups (and preferably hydroxyl groups or carboxyl groups) that exist on the surface of the resist pattern and react with the metal compound (W), and the metal compound (W), so that the metal compound (W) or metal ions thereof are bonded to the surface of the pattern.

Furthermore, the term "physical adsorption" describes the state where the metal compound (W) or metal ions thereof are bonded to the surface of the pattern or underlying film via weak intermolecular forces such as van der Waals forces.

In the present invention, the solvent (S1) preferably has a boiling point of at least 40° C., and more preferably 80° C. or higher. Using such a solvent ensures a more favorable coating selectivity, meaning the surface of the template or organic film can be coated selectively. Further, because the surface of the template or organic film can be coated selectively, the etching selectivity ratio between those portions of the substrate in which the metal oxide layer exists thereon (namely, the coated substrate portions) and those portions of the substrate where the metal oxide layer does not exist (namely, the uncoated substrate portions) can be improved.

In the present description, the "etching selectivity ratio" refers to the apparent difference in etching rate between the metal oxide layer and the uncoated substrate portions when the uncoated substrate portions are subjected to etching using the metal oxide layer on the coated substrate portions as a mask. It is thought that the reason for this favorable etching selectivity ratio is that when the metal oxide layer-forming material containing the solvent (S1) is applied to the surface of the template or organic film, the solvent (S1) undergoes almost no volatilization, and is retained within the coated material, during the period from when the film-forming material is applied until the metal compound (W) undergoes hydrolysis to generate a film. In other words, following application of the metal oxide layer-forming material to the surface of the template or organic film to form a coating film, if the solvent within the coating film volatilizes before the metal compound (W) hydrolyzes to form a film, then the metal compound (W) may undergo physical adsorption to form a metal oxide layer not only at the surface of the template or organic film, but also at the surface of the uncoated substrate portions, thereby lowering the apparent etching selectivity ratio. However, it is thought that if the boiling point of the solvent (S1) is within the temperature range described above, then volatilization of the solvent (S) is suppressed, thereby addressing the above problems.

In particular, if the metal oxide layer-forming material is applied, and the surface is then washed (subjected to a rinse treatment), then the etching selectivity ratio relative to the uncoated substrate portions improves even further. It is surmised that this observation is due to the fact that because the solvent (S) is retained and undergoes almost no volatilization in the period prior to washing, the metal compound (W) on the surface of the pattern, which has undergone comparatively strong adhesion via chemical adsorption or the like, remains adhered to the pattern even when subjected to washing, whereas the metal compound (W) on the surface of the uncoated substrate portions, which is adhered comparatively weakly by physical adsorption or the like, is removed by the washing process, and that as a result, almost no metal oxide layer is formed on the surface of the uncoated substrate portions.

Although there are no particular restrictions on the upper limit for the boiling point of the solvent (S1), if due consideration is given to factors such as the coating properties, then the boiling point is preferably not more than 300° C., and is more preferably 250° C. or lower.

The solvent (S1) is preferably an aliphatic compound, as such compounds yield superior effects for the present invention.

The aliphatic compound may be either a chain-like compound that contains no rings within the structure, or a cyclic compound that contains a ring within the structure, although a cyclic compound is preferred. Furthermore, the cyclic compound is preferably a hydrocarbon, and is most preferably a saturated hydrocarbon.

Examples of this type of cyclic compound include monocycloalkanes, polycycloalkanes such as bicycloalkanes, tricycloalkanes and tetracycloalkanes, and compounds in which a substituent group such as an alkyl group is bonded to a ring of one of these compounds.

As the chain-like compound, alkane-based solvents of 6 to 10 carbon atoms are preferred, and specific examples of these alkane-based solvents include n-hexane (boiling point: approximately 69° C.) and n-heptane (boiling point: approximately 98° C.).

Examples of the cyclic compound include compounds represented by General Formula (s-1) shown below.

[Formula 20]

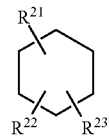

(s-1)

[wherein, $R^{21}$ to $R^{23}$ each independently represents a hydrogen atom or a linear or branched alkyl group, at least two of $R^{21}$ to $R^{23}$ represent alkyl groups, and those alkyl groups may also be bonded to a carbon atom within the cyclohexane ring other than the carbon atom to which the alkyl group is bonded, thereby forming a ring.]

In Formula (s-1), of $R^{21}$ to $R^{23}$, at least two groups are linear or branched alkyl groups. In other words, in the compound (s-1), either two of $R^{21}$ to $R^{23}$ may be linear or branched alkyl groups, with the other group being a hydrogen atom, or all of $R^{21}$ to $R^{23}$ may be linear or branched alkyl groups. In the present invention, compounds in which two of $R^{21}$ to $R^{23}$ are linear or branched alkyl groups are preferred.

The linear or branched alkyl groups for $R^{21}$ to $R^{23}$ are preferably lower alkyl groups of 1 to 5 carbon atoms, and are more preferably alkyl groups of 1 to 3 carbon atoms. Specific examples include a methyl group, ethyl group, propyl group, isopropyl group, n-butyl group, isobutyl group, pentyl group, isopentyl group, and neopentyl group. Of these, a methyl group or isopropyl group is preferred.

The two or more alkyl groups represented by $R^{21}$ to $R^{23}$ may be either the same or different.

In the present invention, at least one of $R^{21}$ to $R^{23}$ is preferably a branched alkyl group, and compounds in which one of the groups is an isopropyl group are particularly preferred.

Compounds containing both an isopropyl group and a methyl group are particularly desirable as the compound (s-1).

The alkyl groups for $R^{21}$ to $R^{23}$ may also be bonded to a carbon atom within the cyclohexane ring other than the carbon atom to which the alkyl group is bonded, thereby forming a ring.

Here, the description that the alkyl group may be "bonded to a carbon atom within the cyclohexane ring other than the carbon atom to which the alkyl group is bonded, thereby forming a ring" means that a group produced by removing a single hydrogen atom from the alkyl group (namely, an alkylene group) links the carbon atom on the cyclohexane ring to which the alkyl group is bonded, and another carbon atom.

There are no particular restrictions on the bonding positions of $R^{21}$ to $R^{23}$, although compounds in which at least two alkyl groups are bonded to the 1st and 4th positions (the para position) or the 1st and 3rd positions (the meta position) of the cyclohexane ring are preferred.

Specific examples of the compounds represented by Formula (s-1) include p-menthane (boiling point: approximately 170° C.), m-menthane (boiling point: approximately 170° C.), o-menthane (boiling point: approximately 170° C.), and pinane (boiling point: approximately 169° C.). The structures of these compounds are shown below.

[Formula 21]

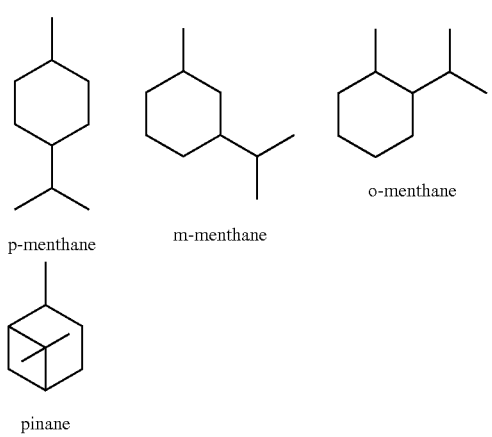

p-menthane   m-menthane   o-menthane pinane

As the solvent (S1), selecting a solvent that has minimal environmental impact is preferred. Examples of this type of solvent include solvents for which the starting raw material is a natural product. Examples of solvents for which the starting raw material is a natural material include terpene-based solvents (including monocyclic monoterpenes such as p-menthane, o-menthane and m-menthane, and bicyclic monoterpenes such as pinane, which are described below) obtained from purified vegetable oil components.

Moreover, in the present invention, in those cases where a material composed of organic materials, such as the aforementioned template-forming material, is used for the template, the solvent (S1) is preferably selected so as not to dissolve the template. By selecting such a solvent, the template shape is less likely to be damaged during formation of the metal oxide layer on the template surface using the metal oxide layer-forming material.

The solvent (S1) single may use either a single compound, or a mixture of two or more different compounds.

The proportion of the solvent (S1) within the solvent (S) is preferably within a range from 50 to 100% by weight, is more preferably from 80 to 100% by weight, and is most preferably 100% by weight.

In the present invention, the solvent (S) may also include a solvent (S2) besides the solvent (S1), namely a solvent that contains a functional group that reacts with the metal compound (W), provided inclusion of this other solvent does not impair the effects of the present invention.

Examples of the solvent (S2) include alcohols such as methanol, ethanol and propanol, and aromatic compounds such as toluene, benzene and cumene, and from the viewpoint of enabling formation of a dense film, cumene (boiling point: approximately 152° C.) is preferred.

The solvent (S2) may use either a single compound, or a mixture of two or more different compounds.

There are no particular restrictions on the quantity used of the solvent (S), but the quantity is preferably sufficient to generate a molar concentration within the metal oxide layer-forming material (the concentration of the combination of the metal compound (W) and any other organic compounds described below, which may be used according to need) within a range from approximately 1 to 200 mM, more preferably from 50 to 150 mM, and most preferably from 50 to 100 mM. Ensuring a molar concentration within this range enables the formation of a more uniform film, and is consequently preferred.

(Optional Components)

Other optional components may also be added to the metal oxide layer-forming material besides the metal compound (W) and the solvent (S).

Examples of these optional components include organic compounds. Adding such compounds means the formed metal oxide layer will include the organic compound as well as the metal oxide.

There are no particular restrictions on the organic compound, provided it dissolves in the solvent (S) described above. Here, the term "dissolves" is not limited to those cases in which the lone organic compound dissolves in isolation, but also includes cases such as 4-phenylazobenzoic acid, which dissolves in solvents such as chloroform upon formation of a complex with a metal alkoxide.

There are no particular restrictions on the molecular weight of the organic compound.

From the viewpoints of further increasing the coating film strength and the adhesion of the coating film to the pattern, the use of an organic compound that contains a plurality of reactive groups (preferably hydroxyl groups or carboxyl groups) and is a solid at room temperature (25° C.) is preferred.

As this type of organic compound, polymer compounds containing hydroxyl groups and/or carboxyl groups such as polyacrylic acid, polyvinyl alcohol, polyvinylphenol, polymethacrylic acid and polyglutamic acid; polysaccharides such as starch, glycogen, and colominic acid; disaccharides and monosaccharides such as glucose and mannose; and porphyrin compounds and dendrimers and the like that contain hydroxyl groups or carboxyl groups at the terminals can be used favorably.

Furthermore, cationic polymer compounds can also be used favorably as the organic compound. Metal alkoxides and metal oxides can undergo an anionic interaction with the cations of cationic polymer compounds, enabling strong bonds to be realized.

Specific examples of cationic polymer compounds include PDDA (polydimethyldiallylammonium chloride), polyethyleneimine, polylysine, chitosan, and dendrimers containing amino groups at the terminals.

These organic compounds function as structural components for forming a thin film with a high degree of mechanical strength. Furthermore, the organic compounds can also perform the roles of a functional site for imparting functionality to the resulting thin film, or as a component for forming a void within the thin film that matches the molecular shape of the organic compound, by removing the compound following film formation.

The organic compound may use either a single compound, or a mixture of two or more different compounds.

In those cases where an organic compound is added, the blend quantity is preferably within a range from 0.1 to 50 parts by weight, and more preferably from 1 to 20 parts by weight, per 100 parts by weight of the metal compound (W).

By using the metal oxide layer-forming material described above, a uniform metal oxide layer can be formed on the surface of the template or the organic film at low temperature and with a high degree of etching resistance. Further, the metal oxide layer formed using the metal oxide layer-forming material exhibits superior etching resistance and a uniform film thickness. As a result, if the structure formed in accordance with the present invention is composed of a metal oxide layer formed using the above metal oxide layer-forming material, then the structure will also exhibit superior etching resistance and uniform size.

Furthermore, according to the metal oxide layer-forming material described above, coating of the surface of the template or organic film can be conducted via a low-temperature treatment (the coating film may be formed by conducting a heat treatment, although the metal oxide layer can also be formed without conducting a heat treatment), and the treatment method is not only simple, meaning an improvement in production efficiency and a reduction in costs can also be achieved, but can also be applied to templates composed of all manner of materials.

[Method of Forming Metal Oxide Layer using Metal Oxide Layer-Forming Material]

In Step (1), in those cases where the metal oxide layer-forming material described above is used to form a metal oxide layer, the metal oxide layer can be formed by applying the metal oxide layer-forming material to the surface of the template to form a coating film, and subsequently drying the coating film.

In other words, in the period following formation of the coating film, until drying of the film is complete, the metal compound (W) within the coating film gradually hydrolyzes and generates hydroxyl groups under the action of moisture in the air, and these hydroxyl groups then undergo a dehydration-condensation, forming a thin film (a metal oxide layer) on the surface of the template. Here, the metal oxide layer refers to a layer composed basically of the metal oxide. In those cases where the metal oxide layer-forming material also includes the type of organic compound described above, the formed metal oxide layer will also include organic material as well as the metal oxide. According to this method, the film is formed at a low temperature (for example, at room temperature (20 to 25° C.)).

In terms of controlling the reactivity, the operation of forming the metal oxide layer is preferably conducted under an inert gas atmosphere. If the atmosphere contains no moisture, then the hydrolysis treatment described below must be conducted to form the film.

The method used for applying the metal oxide layer-forming material can employ a conventional method, and examples of suitable methods include a method in which the substrate with the template formed thereon is immersed in the metal oxide layer-forming material (a dip coating method), and a method in which the metal oxide layer-forming material is applied to the substrate having the template formed thereon using a spin coating method. Furthermore, the coating film may also be formed using other methods such as an alternate adsorption method.

The temperature during application of the metal oxide layer-forming material to the surface of the template (the coating temperature) differs depending on the activity of the metal compound (W) being used, and cannot be readily generalized, but is typically set within a range from 0 to 100° C.

Further, the time elapsed from application of the metal oxide layer-forming material to the template until drying (including application, and if necessary washing and other treatments such as adsorption), namely the contact time between the pre-hydrolysis coating film and the template, and the temperature (the contact temperature) during that time period differ depending on the activity of the metal compound (W) being used, and cannot be readily generalized, although generally, the time period is within a range from several seconds to several hours, and the temperature is usually set within the same range as that specified above for the coating temperature.

There are no particular restrictions on the method used for drying the coating film, and conventional methods may be used. For example, a bake treatment may be conducted, a drying gas such as nitrogen gas may be used, or in those cases where a spinner is used to apply the metal oxide layer-forming material, drying may be conducted by simply spin drying.

Conducting a bake treatment is particularly preferred, as it improves the uniformity of the metal oxide layer formed on the template surface. It is thought that the reason for this observation is that by conducting a bake treatment, cross-linking occurs either between the plurality of hydroxyl groups generated by hydrolysis of the metal compound (W) that exists within the coating film, or between these hydroxyl groups and the template, thereby making the metal oxide layer a more dense film, and improving both the strength of the metal oxide layer and the adhesion of the layer to the template surface.

In this bake treatment, the lower limit for the bake temperature is preferably 100° C., 110° C. is more preferable, and 120° C. is still more preferable.

Provided the bake temperature is at least 100° C., a stronger metal oxide layer can be formed. It is thought that the reason for this observation is that a higher bake temperature facilitates cross-linking between the plurality of hydroxyl groups generated by hydrolysis of the metal compound (W), or between these hydroxyl groups and the pattern.

There are no particular restrictions on the upper limit for the bake temperature, which can be determined with due consideration of factors such as the heat resistance of the material that constitutes the template coated with the metal oxide layer-forming material, although the upper limit is preferably 200° C., more preferably 190° C., and still more preferably 170° C.

Although there are no particular restrictions on the bake time, if factors such as the effects of the post-coating bake treatment and the stability of the template shape are taken into consideration, then the bake time is preferably within a range from 30 to 300 seconds, and more preferably from 60 to 180 seconds.

In Step (1), following formation of the coating film, the coating film is preferably washed with an organic solvent (S"). By conducting this washing, excess metal compound (W) such as the metal compound (W) adhered to portions on the substrate surface where the template does not exist is either washed away or reduced to an extremely low concentration. In contrast, the metal compound (W) on the template surface is retained due to its powerful bonding to the template. As a result, a metal oxide layer is formed satisfactorily on the template surface, whereas on those portions of the substrate surface where the template does not exist, a metal oxide layer is either not formed at all or formed only in minimal amounts, meaning the surface of the template can be coated with a high degree of coating selectivity.

Moreover, as described above, by conducting washing, the metal oxide layer becomes a more uniform layer with a very thin film thickness. In other words, by conducting washing, excess metal compound (W) on the template that is not adsorbed chemically is removed. On the other hand, the metal compound (W) that is bonded comparatively strongly to the surface of the template via chemical adsorption or the like remains in a uniform coating on the template surface. As a result, a metal oxide layer at the nanometer level can be formed with a uniform film thickness, at an extremely high level of precision, and with excellent reproducibility.

As the organic solvent (S"), any solvent having no functional groups that react with the metal compound (W) may be used, and the solvent may be selected from amongst conventional organic solvents.

Because the solvent makes contact with the template such as the resist pattern during washing, the organic solvent (S") is preferably a solvent that does not dissolve the template. This ensures that when the organic solvent (S") is applied to the template surface, the shape of the template is less likely to be damaged. As the organic solvent (S"), the solvents (S) described above are preferred.

The washing can be conducted using a conventional method, and examples include a method in which the organic solvent (S") is supplied to the surface of the coating film formed from the metal oxide layer-forming material using a spraying method or the like, and the excess organic solvent (S") is then suctioned off under reduced pressure, a method in which the coating film is washed by immersion in the organic solvent (S"), a spray cleaning method, a steam cleaning method, or a method in which the organic solvent (S") is applied to the pattern using a spin coating method. A spin coating method is particularly preferred.

The washing conditions (such as the wash time and the quantity used of the organic solvent (S")) may be set appropriately in accordance with factors such as the washing method employed and the nature of the organic solvent (S").

For example, when washing is conducted using a spin coating method, the washing conditions may be set such that the spin speed is within a range from 100 to 5,000 rpm, and the wash time is from 1 to 100 seconds.

The washing is preferably conducted before the solvent (S) within the coating film has volatilized completely. A determination as to whether or not the solvent (S) within the coating film has volatilized completely can be made by visual inspection.

In this step, if required, a standing treatment or the like that allows the chemical adsorption and/or physical adsorption between the template and the metal compound (W) to proceed may be included in the period following application of the metal oxide layer-forming material to form the coating film but prior to conducting drying.

Furthermore, in this step, a hydrolysis treatment may be conducted in the period following formation of the coating film and before drying is conducted, by bringing the coating film into contact with water, thereby causing hydrolysis of the metal compound (W) on the film surface, and generating hydroxyl groups at the film surface. This operation facilitates the formation of a metal oxide layer in which a plurality of coating films are laminated on top of one other.

The method used for conducting the hydrolysis treatment can employ conventional methods without any particular restrictions. For example, a sol-gel method in which the coating film is brought into contact with water is the most common. More specific examples include methods in which water is applied to the surface of the coating film, and methods in which the laminate containing the formed coating film is immersed within an organic solvent containing a small quantity of water.

In those cases where a compound that exhibits high reactivity relative to water is included as the metal compound (W), leaving the coating film to stand in the atmosphere causes the metal compound (W) to hydrolyze by reacting with the water vapor in the atmosphere, meaning a separate hydrolysis treatment is unnecessary.

In order to prevent the introduction of impurities and the like, and enable generation of a metal oxide of high purity, deionized water is preferably used as the water.

Furthermore, in the hydrolysis treatment, the time required for completing the treatment can be significantly reduced by using a catalyst such as an acid or a base.

The metal oxide layer incorporated within the coating film may be of a single type, or may include two or more different types.

The thickness of the metal oxide layer is preferably at least 0.1 nm, is more preferably within a range from 0.5 to 50 nm, and is most preferably from 1 to 30 nm. By ensuring the thickness is at least 0.1 nm, favorable resistance to etching, and particularly dry etching such as oxygen plasma etching, can be achieved.

The thickness of the metal oxide layer can be adjusted, for example, by repeating the steps for application, washing and hydrolysis treatment of the metal oxide layer-forming material. In other words, by repeating the series of operations including applying the metal oxide layer-forming material to form a coating film, conducting washing, allowing a standing period if required, and then conducting a hydrolysis treatment, a uniform thin film of the desired thickness can be formed.

By employing this type of operation, a metal oxide layer with a thickness from several nm to several tens of nm, and depending on conditions a thickness of up to several hundred nm, can be formed with superior precision.

For example, in those cases where a metal oxide layer-forming material is used that includes a metal alkoxide with a single metal atom such as silicon tetraisocyanate or titanium butoxide as the metal compound (W), appropriate adjustment of the contact conditions enables thin films with a thickness of several angstroms to be sequentially laminated on top of one other.

In this case, increases in the film thickness per cycle correspond with the number of laminated layers of the metal oxide layer-forming material. On the other hand, when microparticles of an alkoxide gel or the like are used as the metal compound (W), a thin film with a thickness of approximately 60 nm can be laminated within each cycle. Furthermore, in those cases where a spin coating method is used to form a coating film with the metal oxide layer-forming material, appropriate adjustment of factors such as the solvent used, the concentration of the metal compound (W) and the spin speed enable the film thickness to be controlled within a range from several nm up to approximately 200 nm.

In this case, by altering the metal compound (W) used within each cycle, a multilayer metal oxide layer can be obtained in which thin films of different metal compounds (W) are laminated on top of one another.

[Method of Forming Metal Layer by Electroless Plating]

Formation of a metal layer by electroless plating can be conducted, for example, by bringing a plating solution containing ions of a predetermined metal into contact with the template surface, and then reducing those ions (thereby depositing a metal). This process enables the formation of a metal layer composed of the predetermined metal.

In those cases where the target metal is a metal for which direct electroless plating is difficult (for example, noble metals such as gold), a metal layer of the target metal can be formed comparatively easily by first using electroless plating to form a metal layer of a metal (such as nickel) that has a higher ionization tendency than the target metal, and subsequently substituting the metal of the metal layer with the target metal.

There are no particular restrictions on the metal used for electroless plating, and any of the metals typically used for electroless plating can be used. Specific examples include gold, silver, copper, nickel, cobalt, tin, and platinum-group metals (palladium, platinum, rhodium and ruthenium). Of these, at least one metal selected from the group consisting of gold, silver, copper, nickel and cobalt is preferred, as the plating technology for these metals is well established.

In terms of obtaining a structure that has favorable conductivity, the metal that constitutes the metal layer is preferably at least one metal selected from the group consisting of gold, silver and copper. In other words, the metal layer preferably includes either one, or two or more of a gold layer, a silver layer and a copper layer.

Further, cobalt is also preferred as the metal that constitutes the metal layer, as it yields a structure that exhibits powerful magnetism.

The reduction of the metal ions can be conducted using conventional methods. Specific examples include methods that use a reduction reaction catalyst (an electroless plating catalyst), and methods that involve substitution of a metal having a higher ionization tendency than the target metal.

In the present invention, the electroless plating is preferably conducted after introduction of the electroless plating catalyst at the template surface. This catalyst acts as a nucleus for the electroless plating, promoting the reduction reaction of the metal ions that contact the template surface, and therefore enables the efficient formation of a metal layer with a high degree of plating selectivity at the template surface.

As the electroless plating catalyst, fine particles or a thin film of a metal is typically used.

The type of metal used for the catalyst varies depending on the nature of the target metal being used, but is typically either the same as the target metal, or a metal that ionizes more readily than the target metal.

Specifically, in those cases where the target metal is silver, a silver catalyst is normally used, in those cases where the target metal is copper, a silver catalyst or copper catalyst is normally used, and in those cases where the target metal is nickel, cobalt or gold or the like, a palladium catalyst or tin catalyst or the like is normally used. A single catalyst may be used alone, or a combination of two or more catalysts may be used.

Introduction of the catalyst at the template surface can be conducted using conventional methods. For example, an aqueous solution of a salt of the metal that is to act as the catalyst (for example, silver nitrate or a metal chloride or the like) may be brought into contact with the template surface, and the salt subsequently adsorbed to the template surface and then reduced. This enables the introduction of metal microparticles on the template surface.

The metal layer incorporated within the coating film may be of a single type, or may include two or more different types of metal layer.

The thickness of the metal layer may be set appropriately in accordance with the dimensions of the structure being formed, and may be a similar thickness to the metal oxide layer described above.

In the present invention, following Step (1) but prior to conducting the subsequent Step (2), a portion of the coating film formed in Step (1) and the template may be removed. This removal enables a larger number of structures to be formed from a single template than the case in which no template removal is performed.

For example, although described in further detail below, if, as shown in the embodiment shown in FIG. 1, Step (2) (shown as step (c) in FIG. 1) is conducted immediately after completion of Step (1) (shown as step (b) in FIG. 1), then four structures can be formed from a single template. However, if, as shown in the embodiment shown in FIG. 3, a portion of the coating film and the template are removed (shown as step (c) in FIG. 3) following the completion of Step (1) (shown as step (b) in FIG. 3), and Step (2) is then conducted (shown as step (d) in FIG. 3), then six structures can be formed from a single template.

At this time, the removal of a portion of the coating film is preferably conducted so as to expose a portion of the template. This enables the template that had been covered by the coating film to be removed easily by etching or the like.

In the process for removing a portion of the coating film, there are no particular restrictions on the portion removed, and any portion may be removed in any manner. Removal of a single plane that includes a portion of the coating film is preferred. In such a case, this single plane may be parallel to the substrate, perpendicular to the substrate, or at a suitable angle of inclination relative to the substrate. Needless to say, other removal processes may also be used.

In those cases where a rectangular-shaped template is employed, removal of the top portion of the coating film provided on the template surface (also referred to as the upper surface in this description) is particularly preferred. This means the side surface portions of the coating film on the template surface are retained, which enables a self-supporting structure to be formed on the substrate.

When a portion of the coating film is removed, the portion removed preferably represents 1 to 99%, and more preferably 5 to 95% of the entire film.

Further, when a portion of the coating film is removed, a portion of the template inside the coating film is preferably exposed.

Furthermore, during removal of a portion of the coating film, a portion or all of the template may also be removed at the same time.

There are no particular restrictions on the method used for removing a portion of the coating film, provided the method does not depart from the spirit of the present invention, and the method may be appropriately selected from conventional methods, with due consideration of the composition of the metal oxide, and if necessary, the composition of the template. Examples of removal methods that may be used include etching, chemical treatments, physical removal, and polishing methods. Of these methods, etching is preferred, as it is simple and requires minimal steps. Dry etching is particularly preferred. In those cases where the coating film is composed of a metal oxide layer, the dry etching is preferably conducted by plasma etching using a fluorocarbon gas such as $CF_3$. Further, in those cases where the coating film is composed of a metal layer, dry etching using a fluorocarbon gas such as $CF_3$ or argon gas or the like is preferred.

For example, in the case of plasma etching using $CF_3$ gas, the pressure during etching is typically within a range from 1 to 20 Pa (7.5 to 150 mtorr), and is preferably from 2 to 10 Pa (15 to 75 mtorr). Further, the plasma output during etching is typically within a range from 5 to 500 W, and is preferably from 10 to 50 W. The etching treatment time may be set in accordance with factors such as the composition of the coating film and the film thickness. Furthermore, the etching temperature is preferably within a range from −30 to 300° C., more preferably from 0 to 100° C., and is most preferably set to room temperature (5 to 40° C.). There are no particular restrictions on the plasma apparatus used for conducting the etching, and for example, an apparatus such as a PE-2000 Plasma Etcher (a product name) manufactured by South Bay Technology, USA can be used.

Figure 3:
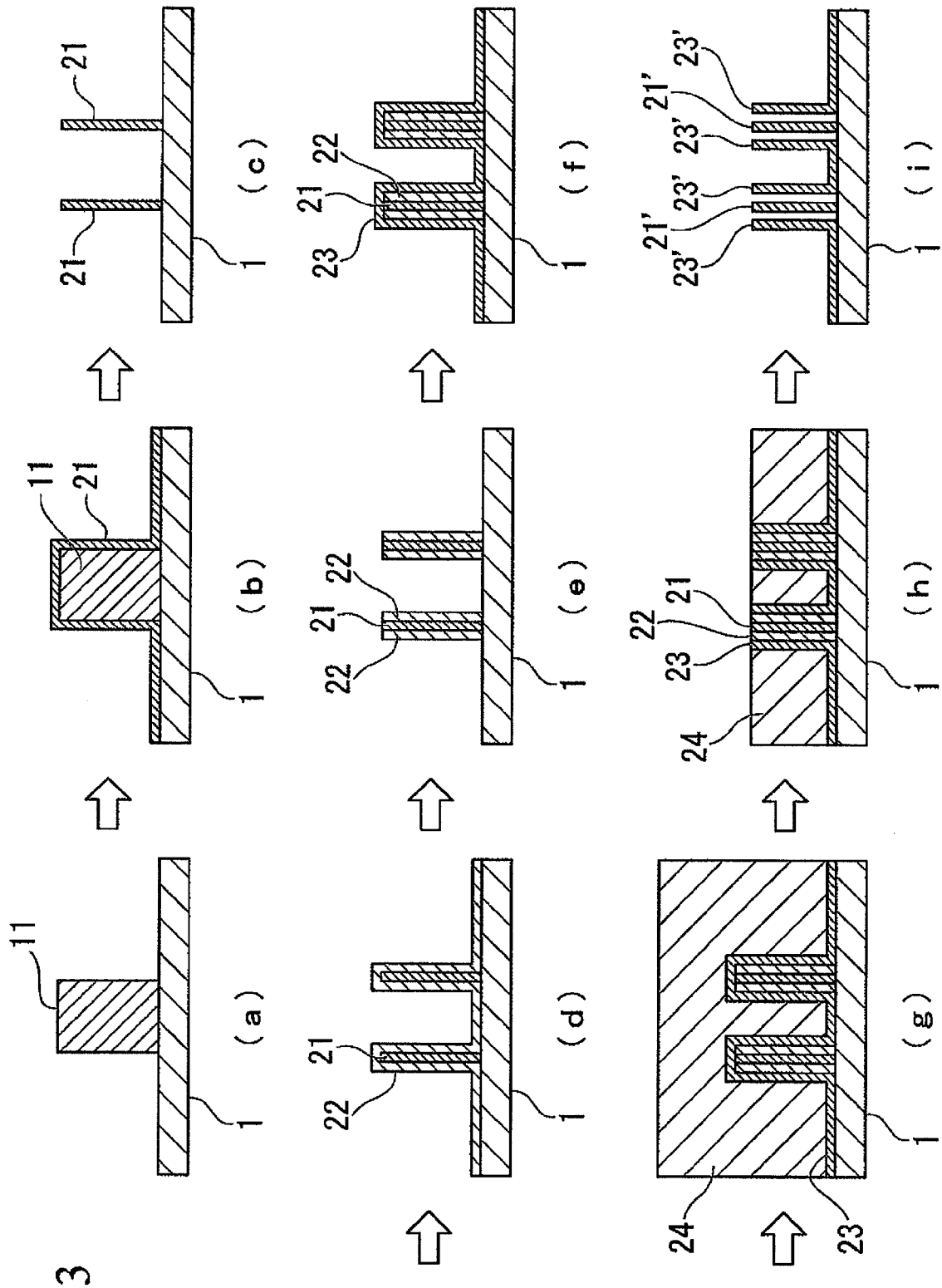
FIG. 3 is a flowchart showing a third embodiment of a production method according to the present invention.

The template may be completely removed, as in the embodiment shown in FIG. 3, or a portion may be removed. If a portion of the template is removed, then 1 to 99% of the entire template is preferably removed, and the removal of 5 to 95% is more preferable.

The method used for removing the template can employ a wide range of conventional template removal methods, which may be selected in accordance with the material that constitutes the template. For example, in those cases where the coating film is composed of a metal oxide layer and the template material is a metal, the template can be removed without damaging the coating film by using an acid to dissolve the metal.

Further, in those cases where the template material is an organic material, then from the viewpoint of controllability, the template is preferably removed by conducting at least one treatment selected from the group consisting of plasma treatments, ozone oxidation treatments, elution and firing. A plasma treatment is particularly desirable.

In cases where a plasma treatment is conducted, the treatment method and treatment conditions may be set in accordance with the composition of the template that is to be removed.

For example, the treatment time, pressure, plasma output and temperature during the plasma treatment may be set in accordance with factors such as the nature and size of the components that are to be removed, and the plasma source.

As the plasma source for the plasma treatment, a variety of gases such as oxygen gas, hydrogen gas or nitrogen gas can be used. Of these, an oxygen plasma treatment that uses oxygen gas or a hydrogen plasma treatment that uses hydrogen gas is preferred, and an oxygen plasma treatment is particularly desirable.

When an oxygen plasma treatment is used, the pressure during the oxygen plasma treatment is preferably within a range from 1.33 to 66.5 Pa (10 to 500 mtorr), and more preferably from 13.3 to 26.6 Pa (100 to 200 mtorr). Further, the plasma output during the oxygen plasma treatment is preferably within a range from 5 to 500 W, and more preferably from 10 to 50 W. Furthermore, the treatment time for the oxygen plasma treatment is preferably within a range from 5 minutes to several hours, and more preferably from 5 to 60 minutes. The temperature during the oxygen plasma treatment is typically a low temperature, and is preferably within a range from −30 to 300° C., more preferably from 0 to 100° C., and is most preferably set to room temperature (5 to 40° C.). There are no particular restrictions on the apparatus used for the oxygen plasma treatment, and for example, an apparatus such as a PE-2000 Plasma Etcher (a product name) manufactured by South Bay Technology, USA can be used.

When a hydrogen plasma treatment is used, the pressure during the hydrogen plasma treatment is preferably within a range from 1.33 to 66.5 Pa (10 to 500 mtorr), and more preferably from 13.3 to 26.6 Pa (100 to 200 mtorr). Further, the plasma output during the hydrogen plasma treatment is preferably within a range from 5 to 500 W, and more preferably from 10 to 50 W. Furthermore, the treatment time for the hydrogen plasma treatment is preferably within a range from 5 minutes to several hours, and more preferably from 5 to 60 minutes. The temperature during the hydrogen plasma treatment is typically a low temperature, and is preferably within a range from −30 to 300° C., more preferably from 0 to 100° C., and is most preferably set to room temperature (5 to 40° C.). There are no particular restrictions on the apparatus used for the hydrogen plasma treatment, and for example, an apparatus such as a PE-2000 Plasma Etcher (a product name) manufactured by South Bay Technology, USA can be used.

When an ozone oxidation treatment is used, the conditions may be set in accordance with the composition of the template that is to be removed and the variety of apparatus used for the treatment. For example, the pressure during the ozone oxidation treatment is preferably within a range from atmospheric pressure to 13.3 Pa (100 mtorr), and more preferably from 133.3 to 13,333.3 Pa (0.1 to 100 torr). Further, the treatment time for the ozone oxidation treatment is preferably within a range from several minutes to several hours, and more preferably from 5 to 60 minutes. The treatment temperature is typically within a range from room temperature to 600° C., and more preferably from room temperature to 400° C.

When an elution treatment is used, a conventional elution method may be employed that is appropriate for the components of the template that is to be removed. For example, in those cases where the template has been formed using a template-forming material containing an aforementioned organic compound with a molecular weight of at least 500, the template can be eluted using an organic solvent such as methanol, ethanol or acetone or the like.

When a firing treatment is used, the treatment conditions preferably include conducting the treatment in the open atmosphere at a temperature within a range from 100 to 1,000° C., and more preferably from 300 to 500° C., for a period of 30 seconds to several hours, and more preferably from 1 to 60 minutes. Further, in those cases where a substrate of a readily oxidizable material such as silicon is used, the firing treatment is preferably conducted under a nitrogen atmosphere in order to prevent oxidation of the substrate. The conditions for a firing treatment conducted in nitrogen are the same as those for a treatment conducted in the open atmosphere.

At this point, the template may be completely removed, or a portion may be removed. If a portion of the template is removed, then 1 to 99% of the entire template is preferably removed, and the removal of 5 to 95% is more preferable.

Furthermore, in those cases where a plurality of templates are provided, the steps for removing the templates may be conducted simultaneously, or may be conducted separately. If conducted separately, then the templates are preferably removed in sequence, starting at the innermost or lowest template.

Moreover, in those cases where a plurality of templates are provided, all of the templates need not necessarily be removed, and each template may be either removed entirely, or removed partially. If a portion of a template is removed, then 1 to 99% of the entire template is preferably removed, and the removal of 5 to 95% is more preferable.

In those cases where the coating film is composed of a metal oxide layer that includes an organic compound as well as the metal oxide, a portion or all of the organic compound may be removed at the same time as removal of the template.

If a portion or all of the organic compound is removed, then those portions corresponding with the organic compound are removed from the metal oxide layer, and as a result, the obtained structure includes voids that correspond with the molecular shape of the removed organic compound. Specific examples include a) structures in which the portions corresponding with the organic compound contained within the metal oxide layer are converted directly to voids, b) structures in which voids are formed that are centered around the portions corresponding with the organic compound contained within the metal oxide layer but which also include neighboring regions, and c) structures in which the portions corresponding with the organic compound contained within the metal oxide layer or the neighboring regions become voids, and portions of these voids are interconnected, generating a network-type void structure.

Structures having these types of voids can be used, for example, as molecular structure-selective transmission films.

If necessary, a step of removing the organic compound within the metal oxide layer may be provided separately from the step of removing the template. Such a separate step may be conducted, as described above, using a plasma, ozone oxidation, elution or firing treatment.

[Step (2)]

In Step (2), an organic film or inorganic film is formed on the surface of the coating film formed in Step (1).

The organic film can be formed using a conventional method, and may be formed, for example, by applying a solution of a film-forming material containing an organic compound having a film-forming capability to the above coating film, and then drying the solution.

As the organic compound having a film-forming capability, the "organic compound with a molecular weight of at least 500" described above in relation to the template-forming material can be exemplified.

The method used for applying the film-forming material can employ a conventional method. Examples of the method include a method in which the substrate with the template formed thereon is immersed in the film-forming material (a dip coating method), a method in which the film-forming material is applied to the substrate having the template formed thereon using a spin coating method, and an alternate adsorption method. Of these, an alternate adsorption method is preferred, as it enables ready control of the thickness of the organic film.

In those cases where the organic film is formed using an alternate adsorption method, the use of an organic film-forming material described below as the material for forming the organic film is preferred.

Examples of the inorganic film include films formed from aluminum oxide, silicon oxide, silver, copper or nickel. These inorganic films can be formed using conventional methods such as sol-gel reaction and plating methods, and sputtering (vapor deposition) methods.

The type of inorganic film used may be selected appropriately with due consideration of factors such as the respective compositions of the coating film and the template. For example, if the coating film is a silica layer, then by using a material such as aluminum oxide that exhibits a different degree of alkali solubility as the inorganic film, the inorganic film can be removed in the subsequent Step (3) or structure formation step without significantly damaging the coating film.

[Organic Film-Forming Material]

An organic film-forming material that can be used favorably in the production method of the present invention is composed of a first aqueous solution containing a water-soluble resin (A1) having sites that adopt a positive charge within an aqueous solution, and a second aqueous solution containing a water-soluble resin (A2) having sites that adopt a negative charge within an aqueous solution.

<First Aqueous Solution>

The first aqueous solution contains a water-soluble resin (A1) having sites that adopt a positive charge within an aqueous solution.

As the water-soluble resin (A1), for example, cationic resins that have conventionally been used in alternate adsorption method can be used. Of these, resins that have salt-forming sites, either within the polymer main chain or on side chain portions, that ionize and adopt a positive charge in an aqueous solution are preferred. These salt-forming sites are composed of a group containing an atom that adopts the positive charge (hereafter also referred to as the "positively charged group"), and a counter ion that neutralizes the positively charged group and forms a salt. Examples of the positively charged group include groups that contain an $N^+$ moiety and groups that contain an $S^+$ moiety.

Examples of groups that contain an $N^+$ moiety include a group in which one hydrogen atom has been removed from $NH_4$ (—$NH_3^+$) or groups in which some or all of the hydrogen atoms of this group have been substituted with substituent groups; a group in which two hydrogen atoms have been removed from $NH_4$ (>$NH_2^+$) or groups in which some or all of the hydrogen atoms of this group have been substituted with substituent groups; and a group in which three hydrogen atoms have been removed from $NH_4$ (≡$NH^+$) or groups in which some or all of the hydrogen atoms of this group have been substituted with substituent groups. Examples of the substituent groups include alkyl groups, alkoxy groups and aryl groups, and of these, alkyl groups of 1 to 5 carbon atoms are preferred.

As the counter ion for the above positively charged group, there are no particular restrictions provided the counter ion is capable of forming a salt with the positively charged group, and examples include halide ions such as a chloride ion, bromide ion, fluoride ion or iodide ion. Of the various possibilities, halide ions are preferred, and a chloride ion or bromide ion is particularly desirable.

Further, besides the sites described above, other sites that may ionize and adopt a positive charge in an aqueous solution include —$NH_2$ and >NH.

As the water-soluble resin (A1), more specific examples include resins containing one or more of the structural units represented by Formulas (11) to (19) shown below. Specific examples of such resins include polydimethyldiallylammonium salts (PDDA) such as polydimethyldiallylammonium chloride (PDDA-Cl) and polydimethyldiallylammonium bromide (PDDA-Br), as well as polyallylamine (PAH), polyethyleneimine (PEI), poly-2-vinyl-1-methylpyridinium bromide (P2VMP), poly-4-vinyl-1-methylpyridinium bromide (P4VMP) and poly-2-methacryloxyethyltrimethylammonium bromide (PMEA).

[Formula 22]

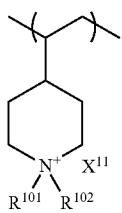

(11)

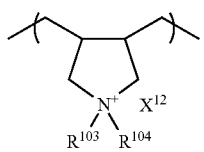

(12)

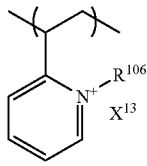

(13)

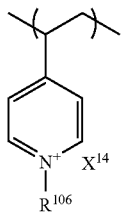

(14)

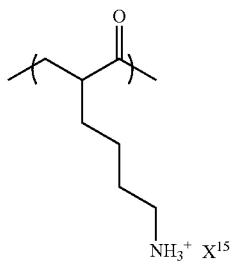

(15)

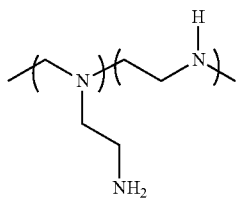

(16)

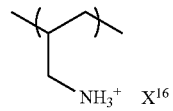

(17)

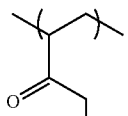

(18)

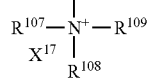

(19)

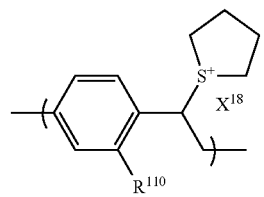

In the above formulas, $R^{101}$ to $R^{110}$ each independently represents an alkyl group of 1 to 5 carbon atoms.

$X^{11}$ to $X^{18}$ each independently represents a halide ion or an anionic organic ion. Examples of the halide ion include a chloride ion or bromide ion or the like. Examples of the anionic organic ion include anionic organic ions of para-toluenesulfonic acid or the like.

In the present invention, the water-soluble resin (A1) preferably includes a cyclic group. This improves the etching resistance of the formed organic film.

The cyclic group may be either an aliphatic cyclic group or an aromatic cyclic group.

In the present description and claims, the term "aliphatic" is a relative concept used in relation to the term "aromatic", and defines a group or compound or the like that contains no aromaticity. An "aliphatic cyclic group" describes a monocyclic group or polycyclic group that contains no aromaticity. An "aromatic cyclic group" describes a monocyclic group or polycyclic group that has aromaticity.

Examples of the structure of the basic ring of the "aliphatic cyclic group", exclusive of substituents, include groups formed solely from carbon and hydrogen (namely, aliphatic hydrocarbon groups), and aliphatic heterocyclic groups in which at least one carbon atom within the ring structure of an aforementioned aliphatic hydrocarbon group has been substituted with a hetero atom such as a nitrogen atom or sulfur atom.

The aliphatic hydrocarbon group may be either saturated or unsaturated, but is preferably saturated. Examples of the aliphatic hydrocarbon group include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Some or all of the hydrogen atoms within these groups may be substituted with substituents (such as a lower alkyl group, fluorine atom or fluoroalkyl group).

Examples of the structure of the basic ring of the "aromatic cyclic group", exclusive of substituents, include groups formed solely from carbon and hydrogen (namely, aromatic hydrocarbon groups), and aromatic heterocyclic groups in which at least one carbon atom within the ring structure has been substituted with a hetero atom such as a nitrogen atom or sulfur atom. Examples of the aromatic hydrocarbon group include aromatic hydrocarbon groups of 6 to 16 carbon atoms, and specific examples include groups in which one or more hydrogen atom have been removed from benzene, naphthalene, anthracene, phenanthrene or pyrene.

In the present invention, the water-soluble resin (A1) is preferably a resin containing a structural unit derived from a diallyldialkylammonium salt (hereafter referred to as "resin (A1-1)"), as such resins exhibit excellent adsorption to the coating film surface.

In the present description and claims, a "structural unit derived from a diallyldialkylammonium salt" describes a structural unit formed by cleavage of an ethylenic double bond (the double bond of an allyl group) within the diallyldialkylammonium salt.

Examples of structural units derived from a diallyldialkylammonium salt include structural units represented by General Formulas (a-1-1) and (a-1-2) shown below.

[Formula 23]

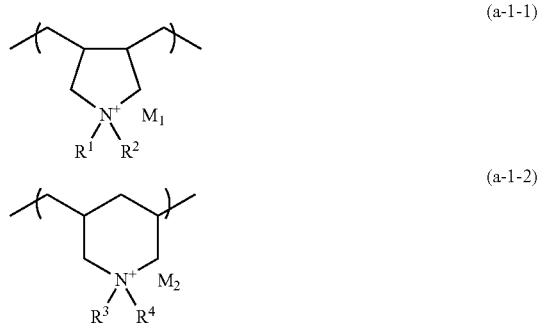

(a-1-1)

(a-1-2)

[wherein, $R^1$ to $R^4$ each independently represents an alkyl group of 1 to 5 carbon atoms, and $M_1$ and $M_2$ each independently represents a monovalent anion.]

As the alkyl group of $R^1$ to $R^4$, a linear or branched alkyl group of 1 to 5 carbon atoms is preferred, a methyl group or ethyl group is more preferred, and a methyl group is particularly desirable.

As $M_1$ and $M_2$, the same anions as those listed above for the counter ions $X^{11}$ to $X^{18}$ may be exemplified.

In the resin (A1-1), the proportion of the structural unit derived from a diallyldialkylammonium salt, relative to the combined total of all the structural units that constitute the resin (A1-1), is preferably within a range from 50 to 100 mol %, and more preferably from 75 to 100 mol %. Provided this proportion is at least 50 mol %, the adsorption of the resin to the resist pattern surface is superior, and the film-forming properties of the resist pattern coating film improve.

The resin (A1-1) is most preferably a resin formed solely from structural units derived from a diallyldialkylammonium salt, namely, a polydiallyldialkylammonium salt.

The resin (A1-1) may also include other structural units besides the structural unit derived from a diallyldialkylammonium salt, provided inclusion of these other units does not impair the effects of the present invention. Examples of these other structural units include units derived from monomers that are capable of copolymerization with the diallyldialkylammonium salt.

The resin (A1-1) may use either a single resin, or a combination of two or more different resins.

Further, as the water-soluble resin (A1), a mixed resin containing the resin (A1-1) and another water-soluble resin may also be used.

The weight average molecular weight (which refers to the polystyrene equivalent weight average molecular weight determined using gel permeation chromatography (GPC), this also applies below) of the water-soluble resin (A1) is preferably within a range from 50,000 to 1,000,000, more preferably from 100,000 to 800,000, and still more preferably from 100,000 to 500,000. Provided the molecular weight is within this range, properties such as the dry etching resistance and the adhesion to the resist pattern can be improved.

The water-soluble resin (A1) may use a commercially available resin, or may be synthesized.

The concentration of the water-soluble resin (A1) within the first aqueous solution, relative to the total weight of the first aqueous solution, is preferably within a range from 0.01 to 50% by weight, more preferably from 0.05 to 10% by weight, and still more preferably from 0.1 to 5% by weight. Provided the concentration is within this range, the adhesion of the resin to the coating film surface can be improved.

Besides the water-soluble resin (A1), the first aqueous solution may also include, as optional components, suitable quantities of surfactants for improving the coating properties, ionic strength modifiers, and pH regulators and the like, provided inclusion of these optional components does not impair the effects of the present invention.

Examples of the ionic strength modifiers include inorganic salts (having alkali metal ions) such as NaCl, and organic salts such as sodium para-toluenesulfonate and tetramethyl bromide.

As the pH regulator, typical acids, alkalis and pH regulating buffering agents can be used.

The pH of the first aqueous solution is preferably within a range from 0.1 to 11, more preferably from 0.2 to 9, and is most preferably from 0.1 to 7.

<Second Aqueous Solution>

The second aqueous solution contains a water-soluble resin (A2) having sites that adopt a negative charge within an aqueous solution.

As the water-soluble resin (A2), for example, anionic resins that have conventionally been used in alternate adsorption method can be used. Examples of these anionic resins include resins that have groups (hereafter referred to as negatively charged groups), either within the polymer main chain or on side chain portions, that adopt a negative charge in an aqueous solution. Specific examples of these negatively charged groups include —$SO_3H$, —$SO_3^-M_3$, —COOH, and —$COO^-M_3$, and of these, —$SO_3H$ and —$SO_3^-M_3$ are preferred. In these formulas, $M_3$ is a monovalent cation, for example, an alkali metal ion such as a sodium ion or potassium ion.

As the water-soluble resin (A2), more specific examples include resins containing one or more of the structural units represented by Formulas (21) to (29) shown below. These resin may be used alone, or may be used in mixtures containing two or more different resins.

Specific examples of the water-soluble resin (A2) include polystyrenesulfonic acid (PSS), polyvinylsulfuric acid, polyacrylic acid (PAA), polymaleic acid (PMA), polymaleic acid ammonium salt (PMMA), and mixed resins containing PSS and poly(2,3-dihydrothieno(3,4-b-1,4-dioxin)) (PDHD) (namely, PSS-PDHD). An example of PSS-PDHD is shown below in Formula (30).

[Formula 24]

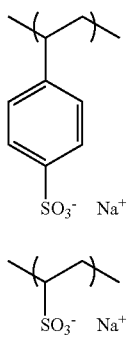
(21)

(22)

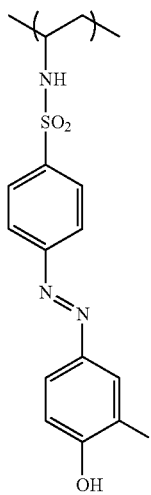
(23)

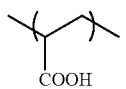
(25)

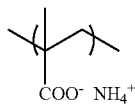
(26)

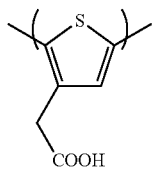
(27)

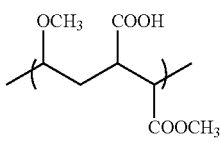
(28)

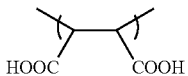
(29)

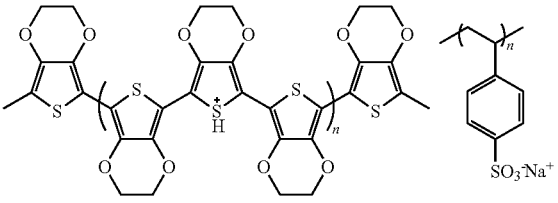
(30)

In the present invention, the water-soluble resin (A2) preferably includes a cyclic group. This improves the etching resistance of the formed organic film.

As the cyclic group, the same cyclic groups as those listed above in the section relating to the water-soluble resin (A1) may be exemplified.

In the present invention, the water-soluble resin (A2) is preferably a resin containing a structural unit derived from a styrenesulfonic acid or a salt thereof (hereafter referred to as "resin (A2-1)").

In the present description and claims, a "structural unit derived from a styrenesulfonic acid or a salt thereof" describes a structural unit formed by cleavage of the ethylenic double bond within the styrenesulfonic acid or a salt thereof.

Examples of structural units derived from a styrenesulfonic acid or a salt thereof include structural units represented by General Formula (a-2-1) shown below.

[Formula 25]

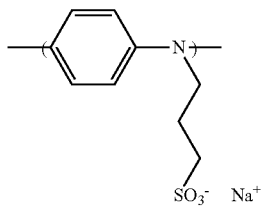
(a-2-1)

[wherein, R represents a hydrogen atom, an alkyl group of 1 to 5 carbon atoms, a halogen atom or a halogenated alkyl group, $R^5$ represents an alkyl group of 1 to 5 carbon atoms, $M_3$ represents a hydrogen atom or a monovalent cation, p represents an integer from 1 to 2, and q represents an integer from 0 to 2.]

Specific examples of the alkyl group for R include lower linear and branched alkyl groups such as a methyl group, ethyl group, propyl group, isopropyl group, n-butyl group, isobutyl group, tert-butyl group, pentyl group, isopentyl group or neopentyl group. Examples of the halogen atom for R include a fluorine atom, chlorine atom, bromine atom or iodine atom. Examples of the halogenated alkyl group for R include groups in which some or all of the hydrogen atoms of an aforementioned alkyl group of 1 to 5 carbon atoms have been substituted with the halogen atoms listed above.

As R, a hydrogen atom or lower alkyl group is preferred, and in terms of industrial availability, a hydrogen atom or a methyl group is the most desirable.

The alkyl group for $R^5$ is as described for the alkyl group for R.

There are no particular restrictions on the cation for $M_3$, and examples include alkali metal ions such as a sodium ion or potassium ion.

As $M_3$, a hydrogen atom is the most desirable.

p is most preferably 1.

q is preferably either 0 or 1, and is most preferably 0.

In the resin (A2-1), the proportion of the structural unit derived from a styrenesulfonic acid, relative to the combined total of all the structural units that constitute the resin (A2-1), is preferably within a range from 50 to 100 mol %, and more preferably from 75 to 100 mol %. Provided this proportion is at least 50 mol %, the adsorption of the resin to the water-soluble resin (A1) is superior, and the film-forming properties of the organic film improve.

The resin (A2-1) is most preferably a resin formed solely from structural units derived from a styrenesulfonic acid, namely, a polystyrenesulfonic acid.

The resin (A2-1) may also include other structural units besides the structural unit derived from a styrenesulfonic acid, provided inclusion of these other units does not impair the effects of the present invention. As this type of other structural unit, any unit derived from a monomer that is capable of copolymerization with the styrenesulfonic acid may be used, and examples of such monomers include ethylene and derivatives thereof, vinyl alcohol and derivatives thereof, acrylic acid and derivatives thereof, acrylamide and derivatives thereof, acrylonitrile and derivatives thereof, methacrylic acid and derivatives thereof, and styrene and derivatives thereof.

The resin (A2-1) may use either a single resin, or a combination of two or more different resins.

Further, as the water-soluble resin (A2), a mixed resin containing the resin (A2-1) and another water-soluble resin may also be used. An example of such a mixed resin is the mixture PSS-PDHD mentioned above.

The weight average molecular weight of the water-soluble resin (A2) is preferably within a range from 500 to 1,500,000, more preferably from 500 to 1,200,000, and still more preferably from 500 to 1,000,000. Provided the molecular weight is within this range, the adhesion to the resist pattern is excellent.

The water-soluble resin (A2) may use a commercially available resin, or may be synthesized.

Besides the water-soluble resin (A2), the second aqueous solution may also include, as optional components, suitable quantities of surfactants for improving the coating properties, ionic strength modifiers, and pH regulators and the like, provided inclusion of these optional components does not impair the effects of the present invention.

Examples of the ionic strength modifiers include inorganic salts (having alkali metal ions) such as NaCl, and organic salts such as sodium para-toluenesulfonate and tetramethyl bromide.

As the pH regulator, typical acids, alkalis and pH regulating buffering agents can be used.

The pH of the second aqueous solution is preferably within a range from 3 to 13, more preferably from 4 to 11, and is most preferably from 6 to 8.

The concentration of the water-soluble resin (A2) within the second aqueous solution, relative to the total weight of the second aqueous solution, is preferably within a range from 0.01 to 50% by weight, more preferably from 0.05 to 10% by weight, and still more preferably from 0.1 to 5% by weight. Provided the concentration is within this range, the adhesion of the resin to the coating film surface can be improved.

[Method of Forming Organic Film Using Organic Film-Forming Material]

Formation of an organic film using the organic film-forming material described above can be achieved by alternately bringing the first aqueous solution and the second aqueous solution of the above organic film-forming material into contact with the surface of the above coating film.

More specifically, an organic film can be formed on the surface of the coating film using a method that includes a step of bringing the first aqueous solution into contact with the surface of the coating film (hereafter referred to as the "first contact step"), and a step of bringing the second aqueous solution into contact with the surface of the coating film that has already been in contact with the first aqueous solution (hereafter referred to as the "second contact step").

In the first contact step, when the first aqueous solution is brought into contact with the surface of the coating film, the sites of the water-soluble resin (A1) that have adopted a positive charge within the first aqueous solution adsorb to the coating film surface, causing a layer of the water-soluble resin (A1) ("the (A1) layer") to form on the surface of the coating film. At this point, provided the water-soluble resin (A1) includes the aforementioned salt-forming sites, the adsorption to the coating film surface occurs more strongly.

There are no particular restrictions on the method used for bringing the first aqueous solution into contact with the coating film surface, and examples include methods in which the substrate with the coating film formed thereon is immersed in the first aqueous solution, and methods in which the first aqueous solution is applied onto the coating film by spin coating.

There are no particular restrictions on the contact time between the coating film surface and the first aqueous solution. For example, even if the contact time is varied within a range from 10 to 60 seconds, almost no variation is observed in the thickness of the (A1) layer formed. It is thought that this is probably because the adsorption of the water-soluble resin (A1) to the coating film surface is completed almost immediately upon contact.

Following the first contact step and prior to conducting the second contact step, the coating film surface that has been in contact with the first aqueous solution may be dried.

There are no particular restrictions on the drying method, and conventional methods may be used. For example, a bake treatment may be performed, or a drying gas such as nitrogen gas may be used. Further, in those cases where the first aqueous solution is applied using a spinner, drying may be conducted by simply spin drying.

Subsequently, the second contact step of bringing the second aqueous solution into contact with the surface of the coating film that has already been in contact with the first aqueous solution is conducted. By conducting this step, the water-soluble resin (A2) within the second aqueous solution adsorbs to the water-soluble resin (A1), thereby forming a layer of the water-soluble resin (A2) (the "(A2) layer") on top of the (A1) layer.

There are no particular restrictions on the method used for achieving the contact with the second aqueous solution, and examples include methods in which the substrate with the (A1) layer formed thereon is immersed in the second aqueous solution, and methods in which the second aqueous solution is applied onto the (A1) layer by spin coating.

There are no particular restrictions on the contact time between the surface of the (A1) layer and the second aqueous solution. For example, even if the contact time is varied within a range from 10 to 60 seconds, almost no variation is observed in the thickness of the (A2) layer formed. It is thought that this is probably because the adsorption of the water-soluble resin (A2) to the (A1) layer is completed almost immediately upon contact.

Similarly, the film thickness of the formed (A2) layer is unaffected by the concentration of the water-soluble resin (A2) within the second aqueous solution, and even if, for example, the concentration is varied within a range from 0.1 to 0.5% by weight, the thickness of the formed (A2) layer is essentially identical.

By conducting the first contact step and the second contact step described above, an organic film composed of a laminated (A1) layer and (A2) layer is formed on the surface of the coating film. The organic film formed in this manner is typically a thin film with a thickness from several nanometers to several tens of nanometers.

In the present invention, following completion of the second contact step, a step is preferably conducted of alternately bringing the above first aqueous solution and second aqueous solution into contact with the surface of the organic film formed following completion of the above second contact step (hereafter, this additional step is referred to as the "alternate contact step"). By conducting this step, an additional (A1) layer and (A2) layer are formed sequentially on top of the (A2) layer formed in the above second contact step, and as a result, the thickness of the organic film formed can be increased. Furthermore, adjusting the number of times the first aqueous solution and second aqueous solution are brought alternately into contact with the surface enables the thickness of the formed organic film to be regulated.

The number of repetitions of the alternating contact with the first aqueous solution and the second aqueous solution (namely, the number of repetitions of the alternate contact step) may be determined in accordance with the desired film thickness. As the number of repetitions is increased, the thickness of the formed organic film also increases.

In the alternate contact step, the coating film surface may be dried prior to conducting the contact with the first aqueous solution and the second aqueous solution. By selecting whether or not drying is conducted, the density of the formed coating film can be altered.

There are no particular restrictions on the drying method and conventional methods may be used. For example, a bake treatment may be performed, or a drying gas such as nitrogen gas may be used. Further, in those cases where the first aqueous solution is applied using a spinner, drying may be conducted by simply spin drying.

In the present invention, a step of washing the substrate surface following contact with the first aqueous solution and the second aqueous solution is preferably also performed. This removes any excess water-soluble resin (A1) and/or water-soluble resin (A2), enabling the formation of an organic film of uniform thickness. Further, by conducting this washing, precipitation of resin on the surface of the formed organic film as a result of salt formation can be prevented.

The washing can be conducted using conventional methods, and may be conducted, for example, using water or the like.

In the present invention, following the second contact step or the alternate contact step, and following the optional washing step, the substrate surface is preferably dried. This improves the film thickness uniformity of the organic film formed on the substrate surface, and also improves the adhesion of the organic film to the substrate surface.

There are no particular restrictions on the drying method and conventional methods may be used. For example, a bake treatment may be performed, or a drying gas such as nitrogen gas may be used. Further, in those cases where the first aqueous solution and/or second aqueous solution are applied using a spinner, drying may be conducted by simply spin drying.

In the present invention, conducting a bake treatment is particularly desirable.

In this bake treatment, the bake temperature is preferably within a range from 100 to 120° C.

There are no particular restrictions on the bake time, which is typically within a range from 30 to 90 seconds.

A structure formed on a substrate in accordance with the present invention is composed of a portion of the coating film formed in the composite film formation step, and a portion of the second coating film formed in the second coating film formation step, and the separation distance between the coating films becomes the separation distance between the formed structures. As a result, by altering the film thickness of the organic film or inorganic film formed in the composite film formation step, the distance between the plurality of structures formed on the substrate can be altered.

The film thickness of the organic film or inorganic film may be selected appropriately in accordance with factors such as the desired pitch between the plurality of structures that are to be formed on the substrate and the mechanical strength required, and although there are no particular restrictions, the film thickness is preferably within a range from 0.1 to 50 nm, more preferably from 1 to 10 nm, and still more preferably from 1 to 5 nm.

[Step (3)]

In Step (3), a portion of the organic film or inorganic film formed in the manner described above, and a portion of the coating film are removed.

In the removal of a portion of the organic film or inorganic film and a portion of the coating film, there are no particular restrictions on the portions that are removed, and any portion may be removed in any manner. Removal of a single plane that includes a portion of the organic film or inorganic film and a portion of the coating film is preferred. In such a case, this single plane may be parallel to the substrate surface, perpendicular to the substrate surface, or at a suitable angle of inclination relative to the substrate surface. Needless to say, other removal processes may also be used.

In this step, removal of the top portion of the organic film or inorganic film and the top portion of the coating film is particularly preferred. Of the various possibilities, in those cases where a template with a rectangular cross-sectional shape is employed (for example, a rectangular line structure, hole structure or columnar structure), removal of the top portion, including the uppermost surface, of the organic film or inorganic film and the coating film provided on the template surface is particularly preferred. In such a case, by adjusting the degree by which the top portion is removed, the height of the final structure can be controlled. Further, if the template is a line-shaped template, then line-shaped structures with a high aspect ratio can be formed on the substrate in a self-supporting erect manner.

There are no particular restrictions on the method used for removing the organic film or inorganic film, provided the method does not depart from the spirit of the present invention, and the method may be appropriately selected from conventional methods, with due consideration of the composition of the organic film or inorganic film, and if necessary, the composition of the coating film and the composition of the template. Examples of removal methods that may be used include etching, chemical treatments, physical removal, and polishing methods. Of these methods, etching is preferred, as it is simple and requires minimal steps. Dry etching is particularly preferred. In the case of an organic film, the dry etching is preferably conducted by oxygen plasma etching.

When an oxygen plasma treatment is used, the pressure during the oxygen plasma treatment is preferably within a range from 1.33 to 66.5 Pa (10 to 500 mtorr), and more preferably from 2.66 to 26.6 Pa (20 to 200 mtorr). Further, the plasma output during the oxygen plasma etching is preferably within a range from 5 to 500 W, and more preferably from 10 to 50 W. Furthermore, the treatment time for the oxygen plasma etching may be determined appropriately in accordance with the composition and film thickness of the organic film. The temperature during the oxygen plasma etching is preferably within a range from −30 to 300° C., more preferably from 0 to 100° C., and is most preferably set to room temperature (5 to 40° C.). There are no particular restrictions on the apparatus used for the oxygen plasma etching, and for example, an apparatus such as a PE-2000 Plasma Etcher (a product name) manufactured by South Bay Technology, USA can be used.

Furthermore, in the case of an inorganic film, examples of suitable removal methods include elution with alkali, elution with acid, and chemical etching.

When removing a portion of the organic film or inorganic film, the portion removed preferably represents 1 to 99%, and more preferably 5 to 95% of the entire film.

Further, when removing a portion of the organic film or inorganic film, the removal preferably exposes a portion of the coating film.

Furthermore, during removal of a portion of the organic film or inorganic film, a portion of the coating film may also be removed at the same time.

As the method of removing the coating film, the same methods as those exemplified above for removing a portion of the coating film formed in Step (1) and the template following Step (1) but prior to conducting the subsequent Step (2) may be used.

When removing a portion of the coating film, the portion removed preferably represents 1 to 99%, and more preferably 5 to 95% of the entire film.

Further, when a portion of the coating film is removed, a portion of the template inside the coating film is preferably exposed.

In the present invention, the removal of a portion of the coating film, and the removal of a portion or all of the organic film or inorganic film may be conducted either consecutively or simultaneously. For example, in the case where a template with a rectangular cross-sectional shape is used, a single etching treatment can be used for removal of the top portion of the organic film or inorganic film, followed by removal of the top portion of the coating film, and then in those cases where a template exists inside the coating film, removal of the top portion of the template.

Furthermore, following Step (1), in those cases where the template is not removed prior to Step (2), removal of the organic film or inorganic film and removal of the coating film during Step (3) is preferably conducted so as to expose a portion of the template. This means that when the template is removed in Step (3) or later, the removal can be performed easily by etching or the like. Further, removal of a portion or all of the template may also be performed at the same time as the removal of a portion of the organic film or inorganic film and/or removal of a portion of the coating film.

Removal of the template can be conducted using the same template removal method described above (the removal method used for removing a portion of the coating film formed in Step (1) and the template following Step (1) but prior to conducting the subsequent Step (2)).

In the present invention, following Step (3), the series of steps from Step (1') to Step (3') described below is preferably performed at least once. This series of steps includes:

(1') forming a coating film composed of a metal layer or a metal oxide layer on the surface of the above organic film or inorganic film that has been partially removed, (2') forming an organic film or inorganic film on the surface of the coating film, and (3') removing a portion of the organic film or inorganic film and a portion of the coating film.

By conducting this series of steps, a number of coating films equal to the number of repetitions of this series of steps is formed on the outer surface of a single template, with an organic film or inorganic film disposed between each coating film, and this enables a greater number of structures to be formed on the substrate. For example, although described in further detail below, if, as shown in the embodiment shown in FIG. 1, the second coating film formation step (shown as step (e) in FIG. 1) is conducted immediately after completion of Step (3) (shown as step (d) in FIG. 1), then four structures can be formed from a single template. However, if, as shown in the embodiment shown in FIG. 2, the series of steps including Step (1') (shown as step (b') in FIG. 2), Step (2') (shown as step (c') in FIG. 2) and Step (3') (shown as step (d') in FIG. 2) is conducted once following the completion of Step (3), then six structures can be formed from a single template. Furthermore, if Step (1') to Step (3') is repeated once more, then eight structures can be formed from a single template.

Step (1') to Step (3') can be performed in the same manner as Step (1) to Step (3) respectively.

At this time, by altering the film thickness of the organic film or inorganic film formed in Step (2'), the distance between the plurality of structures formed on the substrate can be altered. In other words, when Steps (1') to (3') are performed, the structures formed on the substrate in accordance with the present invention are composed of a portion of the coating film formed in Step (1), a portion of the coating film formed in Step (1'), and a portion of the second coating film formed in the second coating film formation step, and the film thickness of the organic film or inorganic film formed in Step (2) and the film thickness of the organic film or inorganic film formed in Step (2') becomes the separation distance between the formed structures. As a result, by altering the film thickness of these organic films or inorganic films, the distance between the plurality of structures formed on the substrate can be altered.

<Second Coating Film Formation Step>

Next, a second coating film composed of a metal layer or metal oxide layer is formed on the surface of the composite film formed in the above composite film formation step.

Formation of the second coating film can be performed in the same manner as Step (1) described above.

Further, the thickness of the second coating film may be the same as that of the coating film formed in Step (1).

Furthermore, the metal layer or metal oxide layer that constitutes the second coating film may be either the same as, or different from, the metal layer or metal oxide layer that constitutes the coating film formed in Step (1). For example, as the metal oxide layer-forming material, if a material is used that contains a different metal compound (W) from that used in Step (1), then a plurality of structures composed of different metal oxides can be formed on top of the substrate.

<Coating Step>

Subsequently, following formation of the second coating film in the manner described above, an organic coating film that covers the surface of the substrate is formed on top of the substrate. As a result, at least a portion of the side surfaces of the second coating film is supported by this organic coating film. Accordingly, when a portion of the second oxide film is removed during the following removal step, damage to those portions of the second coating film that are not to be removed is suppressed, and the final structure exhibits superior shape (including superior self-supporting properties, verticalness relative to the substrate surface, and rectangular formability).

The organic coating film can be formed using conventional methods, and may be formed, for example, by applying a solution of a coating film-forming material containing an organic compound having a film-forming capability to the substrate, and then drying the solution. As the organic compound having a film-forming capability, the "organic compound with a molecular weight of at least 500" described above in relation to the template-forming material can be exemplified.

The method used for applying the film-forming material can employ a conventional method. Examples of the method include a method in which the substrate with the template formed thereon is immersed in the film-forming material (a dip coating method), a method in which the film-forming material is applied to the substrate having the template formed thereon using a spin coating method, and a alternate adsorption method.

There are no particular restrictions on the coating film-forming material, which may be selected appropriately from the aforementioned template-forming materials or organic film-forming materials, or commercially available resist compositions and the like.

There are no particular restrictions on the thickness of the organic coating film, provided it is sufficient to support at least a portion of the side surfaces of the second coating film, but because it is necessary to protect the side surfaces of the coating film, the organic coating film is preferably formed with a film thickness that exceeds the height of the second coating film.

Specifically, the thickness of the organic coating film is preferably approximately 5 to 200%, and more preferably 10 to 150%, of the height of the second coating film.

<Removal Step>

Next, a portion of the second coating film, the side surfaces of which are at least partially supported by the organic coating film, is removed.

There are no particular restrictions on the portion removed in this step, and any portion may be removed in any manner. Removal of a single plane that includes a portion of the second coating film is preferred. In such a case, this single plane may be parallel to the substrate, perpendicular to the substrate, or at a suitable angle of inclination relative to the substrate. Needless to say, other removal processes may also be used.

In those cases where a rectangular shaped template is employed, removal of the top portion of the second coating film is particularly preferred.

This means the side surface portions of the second coating film are retained, which enables a self-supporting structure to be formed on the substrate.

When a portion of the second coating film is removed, the portion removed preferably represents 1 to 99%, and more preferably 5 to 95% of the entire film.

Furthermore, following Step (1), in those cases where the template is not removed prior to Step (2), removal of the second coating film during the removal step is preferably conducted so as to expose a portion of the template. This means that when the template is removed during the removal step or later, the removal can be performed easily by etching or the like. Further, removal of a portion or all of the template may also be performed at the same time as the removal of a portion of the second coating film.

Removal of the template can be conducted using the same template removal method described above in relation to removing a portion of the coating film formed in Step (1) and the template following Step (1) but prior to conducting the subsequent Step (2).

Removal of the second coating film can be performed using the same coating film removal method described for Step (3).

In those cases where, in the aforementioned coating step, the organic coating film has been formed with a thickness that exceeds the height of the second coating film, the thickness of the organic coating film is preferably reduced during this step, prior to removal of a portion of the second coating film.

This reduction in the thickness of the organic coating film may be achieved either via a wet process that uses an alkaline aqueous solution or acid aqueous solution or the like, or via a dry process such as dry etching. For example, in those cases where the organic coating film is alkali-soluble, the thickness of the organic coating film can be reduced by immersing the substrate in an alkaline aqueous solution. Further, dry etching of the organic coating film can be conducted, for example, using the same plasma etching as that used for removal of the above organic film. Of these options, wet processes offer the advantages of causing minimal damage to the surfaces of the coating film and organic film, and being low-cost.

<Structure Formation Step>

Subsequently, a structure composed of a metal oxide is formed on top of the substrate by removing all residues left on the substrate except for the aforementioned coating film and second coating film.

In other words, following completion of the above removal step, at least a portion of the composite film composed of the organic film or inorganic film and the coating film formed in the composite film formation step, a portion of the second coating film formed in the second coating film formation step, and a portion of the organic coating film formed in the coating step still remain on top of the substrate. Furthermore, in those cases where a portion of the coating film and the template were not removed following Step (1), the template also remains on the substrate. By removing all of these items except for the coating film and the second coating film, a plurality of structures formed from a portion of the coating film and a portion of the second coating film are obtained on top of the substrate.

Removal of these residues can be achieved using the same coating film removal methods, organic film removal methods, inorganic film removal methods and template removal methods as those described above in relation to Step (3) and the removal step and the like.

A description of preferred embodiments of the production method of the present invention is presented below with reference to the drawings, although needless to say, the following description does not exclude embodiments different from those described below.

First Embodiment

FIG. 1 shows a flowchart for a first embodiment.

In this embodiment, first, as shown in FIG. 1(a), a template 11 composed of a line structure having a rectangular cross-sectional shape (namely, a rectangular line structure) is formed on a substrate 1 (Step (a)).

Next, as shown in FIG. 1(*b*), a coating film 12 is formed so as to cover the surface of the template 11 (Step (b)).

Subsequently, as shown in FIG. 1(*c*), an organic film 13 is formed so as to cover the surface of the coating film 12 (Step (c)).

Next, as shown in FIG. 1(*d*), the top portions of the organic film 13 and the coating film 12 are removed along a plane parallel to the substrate 1, thereby exposing the top edge of the template 11 (Step (d)). As a result, the side surface portions of the organic film 13, the side surface portions of the coating film 12, and the template 11 remain on the substrate 1. At this point, the top of the template 11 may also be removed together with the top portions of the organic film 13 and the coating film 12.

Next, as shown in FIG. 1(*e*), a coating film 14 is formed so as to cover the surfaces of the organic film 13, the coating film 12 and the template 11 remaining on the substrate 1 following the above removal (Step (e)).

Subsequently, as shown in FIG. 1(*f*), a thick-film organic coating film 15 having a thickness that exceeds the distance from the surface of the substrate 1 to the top edge of the coating film 14 is formed on top of the substrate 1 (Step (f)), and then, as shown in FIG. 1(*g*), the thickness of this organic coating film 15 is reduced (Step (g)).

Next, as shown in FIG. 1(*h*), the top portion of the organic coating film 15 and the top portion of the coating film 14 are removed along a plane parallel to the substrate 1, thereby exposing the organic film 13, the coating film 12, and the template 11 (Step (h)). At this point, the top portions of the organic film 13, the coating film 12 and the template 11 may also be removed together with the top portion of the organic coating film 15 and the top portion of the coating film 14.

Finally, by removing the residual template 11, organic film 13 and organic coating film 15 from the substrate 1, structures 12' formed from the side surface portions of the coating film 12 and structures 14' formed from the side surface portions of the coating film 14 are obtained on top of the substrate 1, as shown in FIG. 1(*i*) (Step (i)).

Of these structures, the distance between the two adjacent structures 12' corresponds with the width of the template 11, whereas the distance between the adjacent pairs of structures 12' and 14' corresponds with the film thickness of the organic film 13.

In this embodiment, four line-shaped structures (two structures 12' and two structures 14') are obtained from a single template.

Second Embodiment

Figure 2:
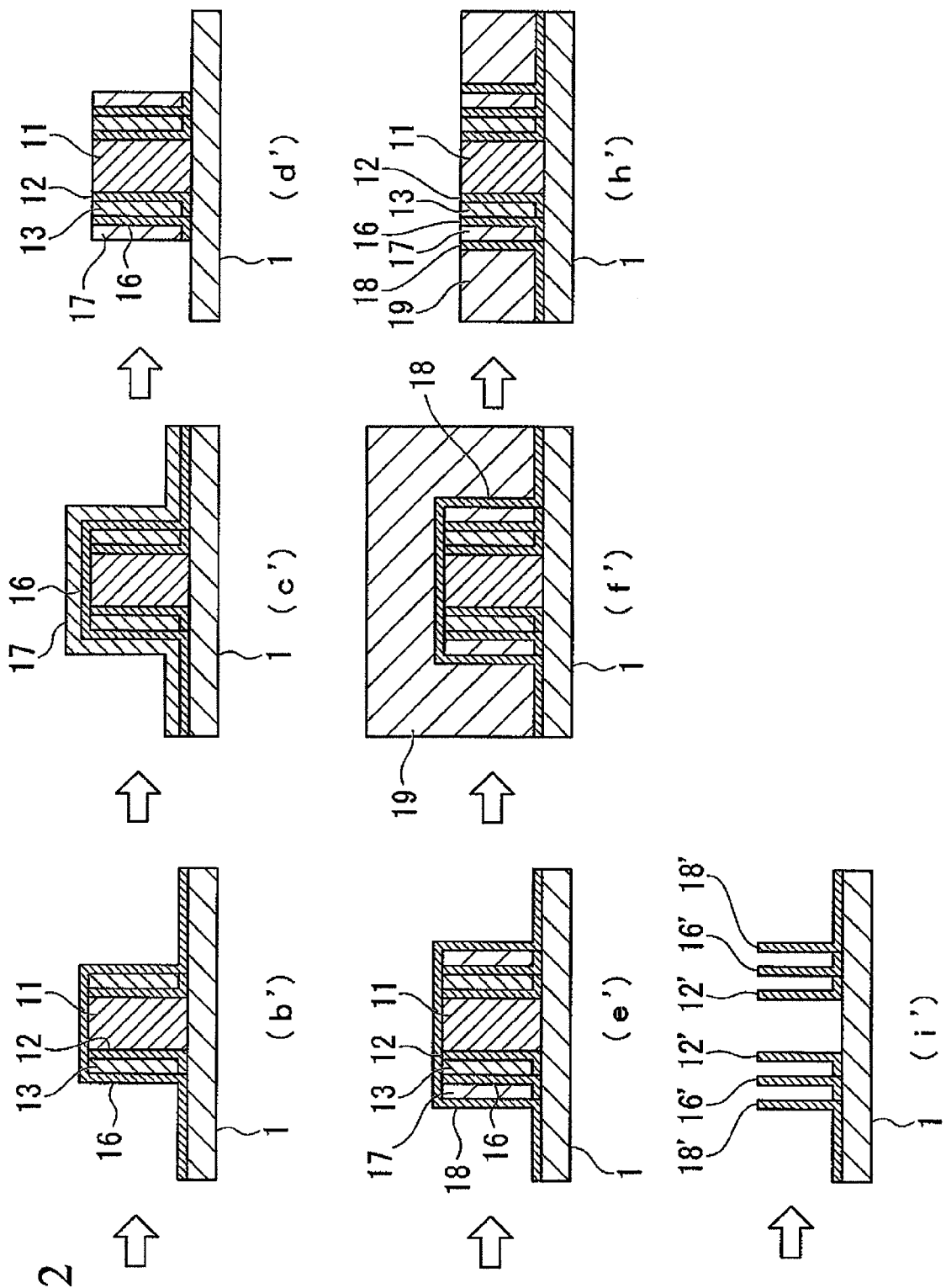
FIG. 2 is a flowchart showing a second embodiment of a production method according to the present invention.

FIG. 2 shows a flowchart for a second embodiment. In the following descriptions of embodiments, items that are identical to those of the first embodiment are labeled using the same symbols, and detailed descriptions of these identical items are omitted.

In this embodiment, first, Steps (a) to (d) are conducted in the same manner as the first embodiment described above.

Next, as shown in FIG. 2(*b'*), a coating film 16 is formed so as to cover the surfaces of the organic film 13, the coating film 12 and the template 11 remaining on the substrate 1 following the prior removal step (Step (b')).

Next, as shown in FIG. 2(*c'*), an organic film 17 is formed so as to cover the surface of the coating film 16 (Step (c')).

Subsequently, as shown in FIG. 2(*d'*), the top portions of the organic film 17 and the coating film 16 are removed along a plane parallel to the substrate 1, thereby exposing the top edges of the organic film 13, the coating film 12 and the template 11 (Step (d')). As a result, the side surface portions of the organic film 17, the side surface portions of the coating film 16, the side surface portions of the organic film 13, the side surface portions of the coating film 12, and the template 11 remain on the substrate 1. At this point, the top portions of the organic film 13, the coating film 12 and the template 11 may also be removed together with the top portions of the organic film 17 and the coating film 16.

Next, as shown in FIG. 2(*e'*), a coating film 18 is formed so as to cover the surfaces of the organic film 17, the coating film 16, the organic film 13, the coating film 12 and the template 11 remaining on the substrate 1 following the above removal (Step (e')).

Subsequently, as shown in FIG. 2(*f''*), a thick-film organic coating film 19 having a thickness that exceeds the distance from the surface of the substrate 1 to the top edge of the coating film 18 is formed on top of the substrate 1 (Step (f'')).

Next, as shown in FIG. 2(*h'*), the top portion of the organic coating film 19 and the top portion of the coating film 18 are removed along a plane parallel to the substrate 1, thereby exposing the organic film 17, the coating film 16, the organic film 13, the coating film 12, and the template 11 (Step (h')). At this point, the top portions of the organic film 17, the coating film 16, the organic film 13, the coating film 12 and the template 11 may also be removed together with the top portion of the organic coating film 19 and the top portion of the coating film 18.

Finally, by removing the residual template 11, organic film 13, organic film 17 and organic coating film 19 from the substrate 1, structures 12' formed from the side surface portions of the coating film 12, structures 16' formed from the side surface portions of the coating film 16, and structures 18' formed from the side surface portions of the coating film 18 are obtained on top of the substrate 1, as shown in FIG. 2(*i'*) (Step (i')).

Of these structures, the distance between the two adjacent structures 12' corresponds with the width of the template 11, the distance between the adjacent pairs of structures 12' and 16' corresponds with the film thickness of the organic film 13, and the distance between the adjacent pairs of structures 16' and 18' corresponds with the film thickness of the organic film 17.

In this embodiment, six line-shaped structures (two structures 12', two structures 16', and two structures 18') are obtained from a single template.

Moreover, in the above embodiment, by repeating Steps (b') to (d') following completion of Step (d'), a number of structures corresponding with the number of repetitions of Steps (b') to (d') (an increase of two structures for each repetition) is formed on the outside of the structures 18' (the opposite side to the side on which the template 11 was located).

Third Embodiment

FIG. 3 shows a flowchart for a third embodiment.

In this embodiment, first, as shown in FIG. 3(*a*), a template 11 composed of a rectangular line structure is formed on a substrate 1.

Next, as shown in FIG. 3(*b*), a coating film 21 is formed so as to cover the surface of the template 11.

Next, as shown in FIG. 3(*c*), the top portion of the coating film 21 is removed to expose the template 11, and the template 11 is subsequently removed. As a result, the side surface portions of the coating film 21 remain on top of the template 11.

Subsequently, as shown in FIG. 3(d), an organic film 22 is formed so as to cover the surface of the coating film 21 (Step (c)).

Next, as shown in FIG. 3(e), the top portion of the organic film 22 is removed along a plane parallel to the substrate 1, thereby exposing the top edge of the coating film 21. At this point, the top portion of the coating film 21 may also be removed together with the top portion of the organic film 22.

Next, as shown in FIG. 3(f), a coating film 23 is formed so as to cover the surfaces of the organic film 22 and the coating film 21 remaining on the substrate 1 following the above removal.

Next, as shown in FIG. 3(g), a thick-film organic coating film 24 having a thickness that exceeds the distance from the surface of the substrate 1 to the top edge of the coating film 23 is formed on top of the substrate.

Subsequently, as shown in FIG. 3(h), the top portion of the organic coating film 24 and the top portion of the coating film 23 are removed along a plane parallel to the substrate 1, thereby exposing the top portions of the organic film 22 and the coating film 21. At this point, the top portions of the organic film 22 and the coating film 21 may also be removed together with the top portion of the organic coating film 24 and the top portion of the coating film 23.

Finally, by removing the residual organic film 22 and organic coating film 24 from the substrate 1, structures 21' formed from the side surface portions of the coating film 21 and structures 23' formed from the side surface portions of the coating film 23 are obtained on top of the substrate 1, as shown in FIG. 3(i).

Of these structures, the distances between a single structure 21' and the two structures 23' adjacent to this structure 21' each correspond with the film thickness of the organic film 22.

In this embodiment, six line-shaped structures (two structures 21' and four structures 23') are obtained from a single template.

In the first to third embodiments described above, erect line-shaped structures are formed on top of the substrate 1 by removing the top portions of the organic films and coating films through a cross-section that is substantially parallel to the substrate, but the present invention is not limited to such cases, and a portion other than the top portion may be removed. This means that structures of complex shapes can be formed.

For example, in the first to third embodiments, if instead of removing the top portions of the organic films and coating films, one side surface is removed through a cross-section perpendicular to the substrate 1, thereby leaving the uppermost surface and one side surface of the films, then line-shaped structures having an L-shaped cross-section can be formed.

Furthermore, organic films were formed in the first to third embodiments, but inorganic films such as aluminum oxide may also be formed.

According to the production method of the present invention described above, a plurality of microscopic structures can be formed easily and with favorable shape. For example, a nanostructure composed of a film having a width within a range from several nanometers to several hundred nanometers, for example a nanostructure having a height of 50 to 500 nm and a width of 10 to 50 nm, or a nanostructure having a height of 10 to 200 nm and a width of 5 to 50 nm, can be formed comparatively easily on top of a substrate. These nanostructures hold considerable promise for application to all manner of fields, including electronic devices, magnetic devices, molecular sensors, catalysts, actuators, separating agents, adsorbents and polarizing films.

Further, according to this production method, the separation distance between the plurality of structures formed on the substrate can be finely controlled, providing a high degree of freedom in terms of designing the shape of the structures.

<<Structure>>

A structure of the present invention is produced using the production method of the present invention described above.

There are no particular restrictions on the shape of the structure. Specific examples of shapes that may be employed include lines, cylinders and three dimensional structures, as well as network structures, composite structures and repeating structures of these shapes.

As described above, because the production method of the present invention enables a nanostructure to be produced with comparative ease, a structure of the present invention is preferably a nanostructure.

EXAMPLES

The present invention is described in further detail below based on a series of examples, but the present invention is in no way limited by these examples.

Of Examples 1 to 4 described below, Examples 1 and 2 correspond with the embodiment shown in FIG. 1, Example 3 corresponds with the embodiment shown in FIG. 2 (an example in which Steps (b') to (d') are each conducted once), and with an example in which Steps (b') to (d') within this embodiment are conducted a further one time (total repetitions: 2), and Example 4 corresponds with the embodiment shown in FIG. 3.

In each example, the gas flow (units: sccm) for the plasma etching refers to the value measured at 1 atm (atmospheric pressure: 1,013 hPa) and 23° C.

Further, the treatment temperature (temperature inside the chamber) during each plasma etching was 25° C.

Example 1

First, a template was formed by a lithography process, using the procedure described below.

A positive resist composition (product name: TDUR-P015 PM, manufactured by Tokyo Ohka Kogyo Co., Ltd.) was applied to the surface of a silicon wafer substrate using a spin coating method, and a prebake was then conducted for 90 seconds at 90° C., forming a resist film having a film thickness of 780 nm. This resist film was then exposed through a mask pattern using a KrF excimer laser exposure apparatus (NSR-S205 manufactured by Nikon Corporation, NA=0.75), subjected to post exposure baking (PEB) for 90 seconds at 110° C., and then developed for 60 seconds using a 2.38% by weight aqueous solution of tetramethylammonium hydroxide, thus forming a resist pattern (template) composed of a rectangular line structure having a width of approximately 500 nm, a length of approximately 10 mm and a height of approximately 780 nm n.

The silicon wafer substrate bearing the resist pattern formed in this manner was then subjected to an oxygen plasma treatment (10 sccm, 10 Pa, 10 W, 3 minutes), thereby reducing the size of the rectangular line structure to a width of approximately 300 nm, a length of approximately 10 mm and a height of approximately 480 nm, and this structure was used as the template.

Next, 500 μl of a silicon tetraisocyanate ($Si(NCO)_4$) solution (in heptane: 50 mM) was dripped onto the surface of the substrate and left to stand for 7 seconds. Subsequently, 15 ml of heptane was dripped onto the substrate, and the substrate was spun for 11 seconds (at 1,000 rpm) under a stream of nitrogen, thereby drying the substrate surface.

This series of operations (a surface sol-gel operation) involving dropwise addition of the silicon tetraisocyanate solution→washing→drying was conducted 30 times, thereby forming a silicon oxide ($SiO_2$) layer (hereafter referred to as a "silica layer") with a film thickness of approximately 30 nm on the template surface.

Subsequently, 3 ml of a 3 mg/ml aqueous solution of a PDDA (PDDA-Cl; polydiallyldimethylammonium chloride, Mw: 240,000) was dripped onto the surface of the substrate having the silica layer formed thereon, and was then left to stand for 10 seconds. 25 ml of pure water was then dripped onto the surface, and the substrate was spun for 17 seconds (at 1,000 rpm) under a stream of nitrogen, thereby drying the substrate surface. Subsequently, 3 ml of a 3 mg/ml aqueous solution of a PSS (PSS; polystyrenesulfonic acid, Mw: 70,000) was dripped onto the substrate surface and left to stand for 10 seconds. 25 ml of pure water was then dripped onto the surface, and the substrate was spun for 17 seconds (at 1,000 rpm) under a stream of nitrogen, thereby drying the substrate surface.

This series of operations (a polymer contact operation) involving the immersion in the PDDA aqueous solution through to immersion in the PPS aqueous solution and subsequent washing and drying was deemed to represent one set, and this polymer contact operation was repeated until a total of 80 sets had been completed, thereby forming a polymer layer with a film thickness of approximately 50 nm on the silica layer-coated template surface.

The substrate with the polymer layer formed thereon was then subjected to an oxygen plasma etching treatment (10 sccm, 10 Pa, 70 W, 30 seconds) using an RIE (Reactive Ion Etching) apparatus RIE-10NR (a product name, manufactured by SAMCO, Inc.), thereby removing the polymer layer formed on the top surface of the rectangular line structure. A further plasma etching treatment using $CHF_3$ gas (30 sccm, 2 Pa, 70 W, 45 seconds) was then conducted to remove the silica layer on the upper surface of the rectangular line structure, and a further oxygen plasma etching treatment (10 sccm, 10 Pa, 10 W, 3 seconds) was then performed.

Next, 500 µl of a silicon tetraisocyanate ($Si(NCO)_4$) solution (solvent: heptane, $Si(NCO)_4$ concentration: 50 mM) was dripped onto the surface of the substrate and left to stand for 7 seconds. Subsequently, 15 ml of heptane was dripped onto the substrate, and the substrate was spun for 11 seconds (at 1,000 rpm) under a stream of nitrogen, thereby drying the substrate surface.

This series of operations (a surface sol-gel operation) from dropwise addition of the silicon tetraisocyanate solution through to washing and drying was conducted 30 times, thereby forming a silica layer with a film thickness of approximately 30 nm.

A resist composition (product name: OFPR-800LB, manufactured by Tokyo Ohka Kogyo Co., Ltd.) was spin coated onto the substrate having the silica layer formed thereon, thereby forming a resist film with a film thickness of approximately 1 µm on top of the substrate.

Subsequently, the silicon wafer substrate was immersed for 9 minutes in a developing solution (product name: NMD, manufactured by Tokyo Ohka Kogyo Co., Ltd.), and the substrate surface was then washed with pure water and dried under a stream of nitrogen gas.

Subsequently, a plasma etching treatment using a mixed gas of oxygen and $CHF_3$ (oxygen gas flow rate: 10 sccm, $CHF_3$ flow rate: 30 sccm, 2 Pa, 70 W, 10 minutes) was performed using an RIE (Reactive Ion Etching) apparatus RIE-10NR (a product name, manufactured by SAMCO, Inc.), a further plasma etching treatment was conducted using only $CHF_3$ gas (30 sccm, 2 Pa, 70 W, 3 minutes), and a final plasma etching treatment was then conducted using only oxygen gas (10 sccm, 10 Pa, 10 W, 5 minutes).

Figure 4:
FIG. 4 is a scanning electron microscope image of a structure formed on a substrate in Example 1.

The surface of the resulting substrate was inspected using a scanning electron microscope. FIG. 4 shows a scanning electron microscope image of the substrate surface.

As shown in FIG. 4, it was confirmed that silica lines (nanostructures) having a width of approximately 33 nm and a height of approximately 320 nm had been formed.

Moreover, the spacing between adjacent silica lines was 45 nm at its narrowest. Because this spacing corresponds with the film thickness of the polymer layer that was sandwiched between the two silica layers, it is surmised that the pitch between adjacent silica line structures can be controlled by altering the film thickness of the polymer layer.

The microscope image also confirmed that the side surfaces of the lines were extremely smooth.

Furthermore, it was also evident that these silica lines had a high aspect ratio relative to the line width (in this example, the height/width ratio was approximately 8), and that the silica lines exhibited favorable self-supporting properties.

Example 2

Using the same procedure as Example 1, a template composed of a rectangular line structure having a width of approximately 300 nm, a length of approximately 10 mm and a height of approximately 480 nm was formed on the surface of a silicon wafer substrate.

Subsequently, by subjecting the substrate to 30 repetitions of the same surface sol-gel operation as that described in Example 1, a silica layer with a film thickness of approximately 30 nm was formed on the template surface.

Next, by subjecting the substrate with the silica layer formed thereon to a predetermined number of repetitions (15, 30, 60 or 90 repetitions) of the same polymer contact operation as that described in Example 1, a polymer layer was formed on the silica layer-coated template surface.

The substrate with the polymer layer formed thereon was then subjected to an oxygen plasma etching treatment (10 sccm, 10 Pa, 70 W) using an RIE (Reactive Ion Etching) apparatus RIE-10NR (a product name, manufactured by SAMCO, Inc.), thereby removing the polymer layer on the top surface of the rectangular line structure. A further plasma etching treatment using $CHF_3$ gas (30 sccm, 2 Pa, 70 W) was then conducted to remove the silica layer on the upper surface of the rectangular line structure, and a further oxygen plasma etching treatment (10 sccm, 10 Pa, 10 W, 3 seconds) was then performed.

Subsequently, the substrate was subjected to 30 repetitions of the same surface sol-gel operation as that described in Example 1, thereby forming a silica layer with a film thickness of approximately 30 nm.

A resist composition (product name: OFPR-800LB, manufactured by Tokyo Ohka Kogyo Co., Ltd.) was spin coated onto the substrate having the silica layer formed thereon, thereby forming a resist film with a film thickness of approximately 1 µm on top of the substrate.

Subsequently, a plasma etching treatment using a mixed gas of oxygen and $CHF_3$ (oxygen gas flow rate: 10 sccm, $CHF_3$ flow rate: 30 sccm, 2 Pa, 70 W, 13 minutes) was performed using an RIE (Reactive Ion Etching) apparatus RIE-10NR (a product name, manufactured by SAMCO, Inc.), a further plasma etching treatment was conducted using only $CHF_3$ gas (30 sccm, 2 Pa, 70 W, 3 minutes), and a final plasma etching treatment was then conducted using only oxygen gas (10 sccm, 10 Pa, 10 W, 5 minutes).

Inspection of the surface of the resulting substrate using a scanning electron microscope confirmed that a plurality of silica lines (nanostructures) having a width of approximately 33 nm and a height of approximately 320 nm had been formed.

For this example, a graph was generated by placing the number of polymer contact operation repetitions along the horizontal axis, measuring the silica line pitch that corresponded with each number of polymer contact operation repetitions, and plotting the results of those measurements along the vertical axis. The graph is shown in FIG. 5.

Figure 5:
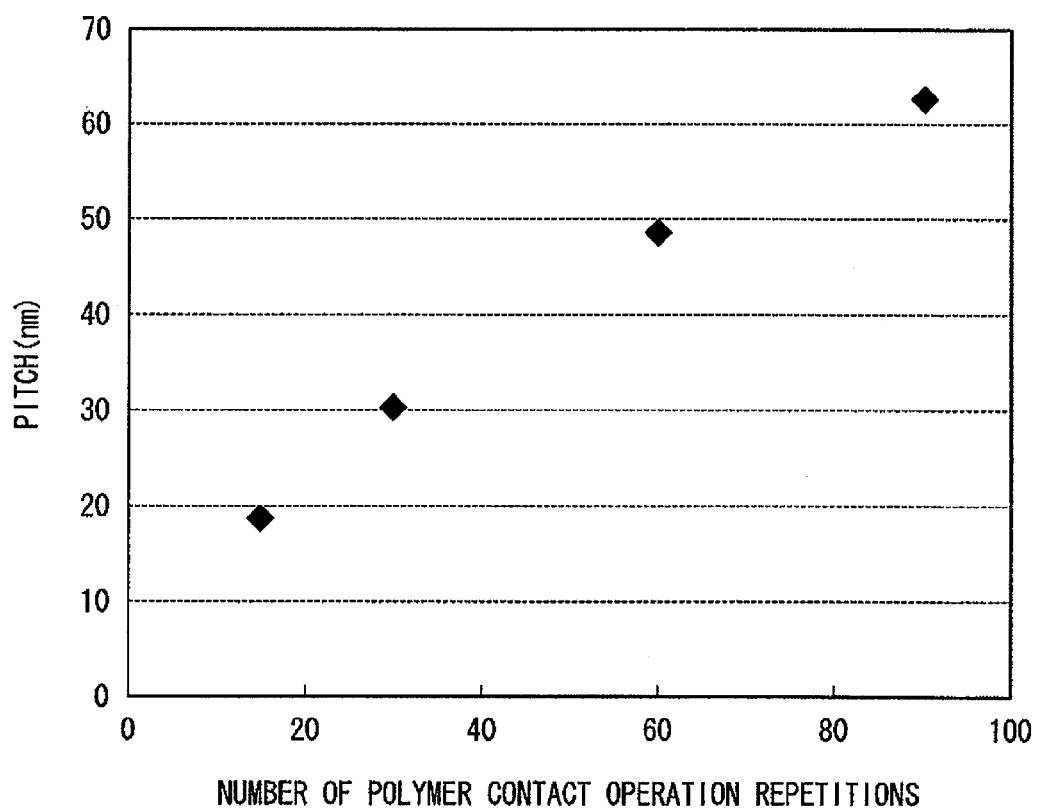
FIG. 5 is a graph showing the number of polymer contact operation repetitions along the horizontal axis and the pitch of the formed structure along the vertical axis for Example 2.

As is evident from FIG. 5, the number of polymer contact operation repetitions and the pitch are proportional. These results confirmed that by adjusting the number of polymer contact operation repetitions, the spacing between the structures could be altered.

Example 3

Using the same procedure as Example 1, a template composed of a rectangular line structure having a width of approximately 300 nm, a length of approximately 10 mm and a height of approximately 480 nm was formed on the surface of a silicon wafer substrate.

Subsequently, by subjecting the substrate to 30 repetitions of the same surface sol-gel operation as that described in Example 1 (hereafter referred to as "surface sol-gel operation A"), a silica layer with a film thickness of approximately 30 nm was formed on the template surface.

Next, by subjecting the substrate with the silica layer formed thereon to 80 repetitions of the same polymer contact operation as that described in Example 1, a polymer layer with a film thickness of approximately 50 nm was formed on the silica layer-coated template surface.

The substrate with the coating film formed thereon was then subjected to an oxygen plasma etching treatment (10 sccm, 10 Pa, 70 W, 30 seconds) using an RIE (Reactive Ion Etching) apparatus RIE-10NR (a product name, manufactured by SAMCO, Inc.). A further plasma etching treatment using $CHF_3$ gas (30 sccm, 2 Pa, 70 W, 45 seconds) was then conducted, and a further oxygen plasma etching treatment (10 sccm, 10 Pa, 10 W, 3 seconds) was then performed.

The above series of plasma etching treatments from the initial oxygen plasma etching treatment, through the $CHF_3$ gas plasma etching treatment to the latter oxygen plasma etching treatment, is termed "etching treatment A".

Subsequently, the series of operations from the surface sol-gel operation A, through the polymer contact operation to the etching treatment A was deemed to represent one set, and a predetermined number of repetitions (either two or three repetitions) of this set were performed.

Next, 500 µl of a silicon tetraisocyanate ($Si(NCO)_4$) solution (solvent: heptane, $Si(NCO)_4$ concentration: 50 mM) was dripped onto the surface of each substrate and left to stand for 7 seconds. Subsequently, 15 ml of heptane was dripped onto the substrate, and the substrate was spun for 11 seconds (at 1,000 rpm) under a stream of nitrogen, thereby drying the substrate surface.

This series of operations (termed "surface sol-gel operation B") from dropwise addition of the silicon tetraisocyanate solution through to washing and drying was conducted 30 times, thereby forming a silica layer with a film thickness of approximately 30 nm.

A resist composition (product name: OFPR-800LB, manufactured by Tokyo Ohka Kogyo Co., Ltd.) was spin coated onto the substrate having the silica layer formed thereon by the surface sol-gel operation B, thereby forming a resist film with a film thickness of approximately 1 µm on top of the substrate.

Subsequently, the silicon wafer substrate was immersed for 9 minutes in a developing solution (product name: NMD, manufactured by Tokyo Ohka Kogyo Co., Ltd.), and the substrate surface was then washed with pure water and dried under a stream of nitrogen gas.

Subsequently, a plasma etching treatment using a mixed gas of oxygen and $CHF_3$ (oxygen gas flow rate: 10 sccm, $CHF_3$ flow rate: 30 sccm, 2 Pa, 70 W, 10 minutes) was performed using an RIE (Reactive Ion Etching) apparatus RIE-10NR (a product name, manufactured by SAMCO, Inc.), a further plasma etching treatment was conducted using only $CHF_3$ gas (30 sccm, 2 Pa, 70 W, 3 minutes), and a final plasma etching treatment was then conducted using only oxygen gas (10 sccm, 10 Pa, 10 W, 5 minutes).

Figure 6:
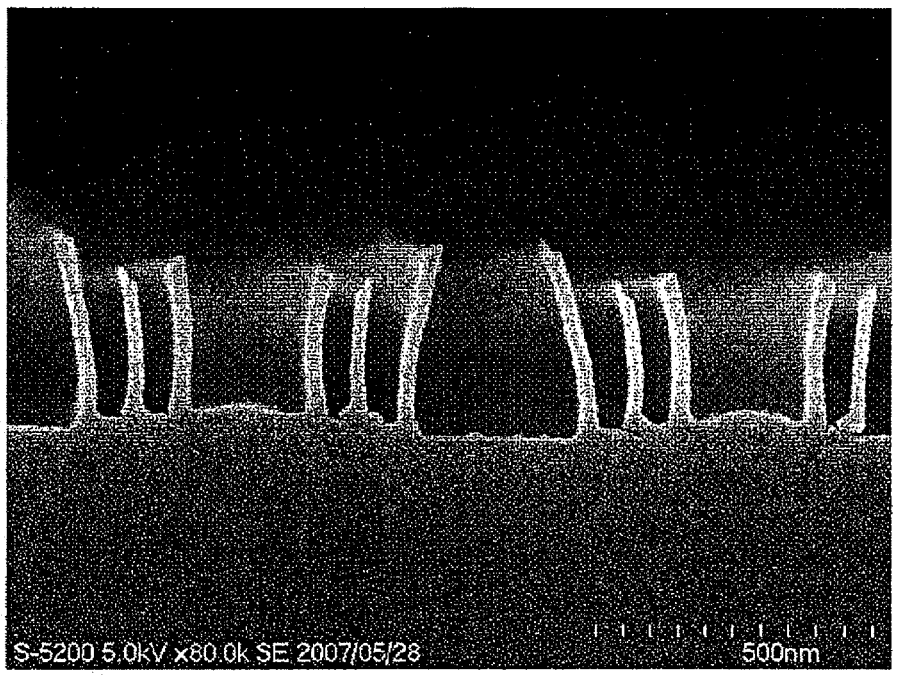
FIG. 6 is a scanning electron microscope image of a structure formed on a substrate in Example 3, wherein the processing set from a surface sol-gel operation A through to a polymer contact operation and etching treatment A is conducted twice.
Figure 7:
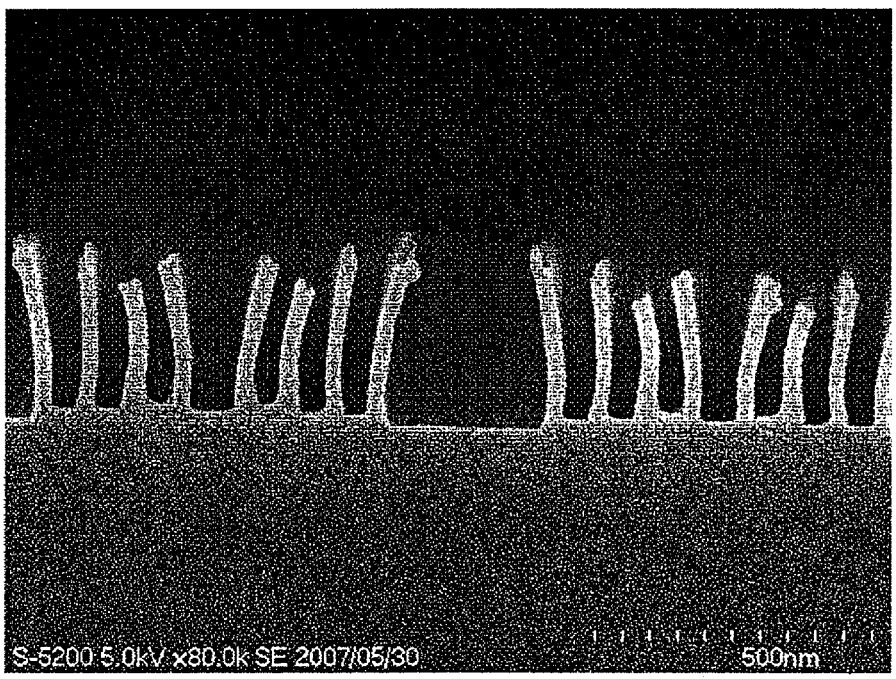
FIG. 7 is a scanning electron microscope image of a structure formed on a substrate in Example 3, wherein the processing set from a surface sol-gel operation A through to a polymer contact operation and etching treatment A is conducted three times.

The surface of the resulting substrates were inspected using a scanning electron microscope. FIG. 6 and FIG. 7 shows scanning electron microscope images of the substrate surfaces.

FIG. 6 shows the results for repeating two sets of the treatment set from the surface sol-gel operation A, through the polymer contact operation, to the etching treatment A, whereas FIG. 7 shows the results for repeating three sets of the treatment set from the surface sol-gel operation A, through the polymer contact operation, to the etching treatment A.

FIG. 6 confirmed that silica lines (nanostructures) having a width of 30 nm and a height of 260 to 300 nm had been formed, whereas FIG. 7 confirmed that silica lines (nanostructures) having a width of 30 nm and a height of 210 to 300 nm had been formed.

Moreover, the spacing between adjacent silica lines (at the narrowest point) was approximately 47 nm in both FIG. 6 and FIG. 7. This spacing corresponds with the film thickness of the polymer layer that was sandwiched between the two silica layers.

The microscope image also confirmed that the side surfaces of the lines were extremely smooth.

Furthermore, it was also evident that these silica lines had a high aspect ratio relative to the line width (in this example, the height/width ratio was approximately 8 to 10), and that the silica lines exhibited favorable self-supporting properties.

In these examples, the number of silica lines formed from a single template increases in accordance with the number of repetitions of the treatment set from the surface sol-gel operation A, through the polymer contact operation, to the etching treatment A. In FIG. 6, where the number of set repetitions was two, 6 silica lines were formed from a single template, whereas in FIG. 7, where the number of set repetitions was three, 8 silica lines were formed from a single template. In this manner, by repeating the treatment series from the surface sol-gel operation A, through the polymer contact operation, to the etching treatment A, the number of structures formed on the substrate can be increased with ease.

Example 4

Using the same procedure as Example 1, a template composed of a rectangular line structure having a width of approximately 300 nm, a length of approximately 10 mm and a height of approximately 480 nm was formed on the surface of a silicon wafer substrate.

Subsequently, by subjecting the substrate to 30 repetitions of the same surface sol-gel operation as that described in Example 1, a silica layer with a film thickness of approximately 30 nm was formed on the template surface.

The substrate with the silica layer formed thereon was then subjected to a plasma etching treatment using $CHF_3$ gas (30 sccm, 2 Pa, 70 W, 3 minutes) and an oxygen plasma etching treatment (10 sccm, 10 Pa, 70 W, 5 minutes) using an RIE (Reactive Ion Etching) apparatus RIE-10NR (a product name, manufactured by SAMCO, Inc.).

The substrate was then subjected to 60 repetitions of the same polymer contact operation as that described in Example 1, thereby forming a polymer layer with a film thickness of approximately 50 nm.

Subsequently, an oxygen plasma etching treatment (10 sccm, 10 Pa, 70 W, 23 seconds) was conducted using an RIE (Reactive Ion Etching) apparatus RIE-10NR (a product name, manufactured by SAMCO, Inc.).

Subsequently, 30 repetitions of the same surface sol-gel operation as that described in Example 1 were performed, thereby forming a silica layer with a film thickness of approximately 30 nm.

A resist polymer (product name: OFPR-800LB, manufactured by Tokyo Ohka Kogyo Co., Ltd.) was then spin coated onto the silicon wafer substrate, thereby forming a resist film with a film thickness of approximately 1 μm on top of the silicon wafer substrate.

Subsequently, a plasma etching treatment using a mixed gas of oxygen and $CHF_3$ (oxygen gas flow rate: 10 sccm, $CHF_3$ flow rate: 30 sccm, 2 Pa, 70 W, 13 minutes) was performed using an RIE (Reactive Ion Etching) apparatus RIE-10NR (a product name, manufactured by SAMCO, Inc.), a further plasma etching treatment was conducted using only $CHF_3$ gas (30 sccm, 2 Pa, 70 W, 2 minutes), and a final plasma etching treatment was then conducted using only oxygen gas (10 sccm, 10 Pa, 10 W, 5 minutes).

Figure 8:
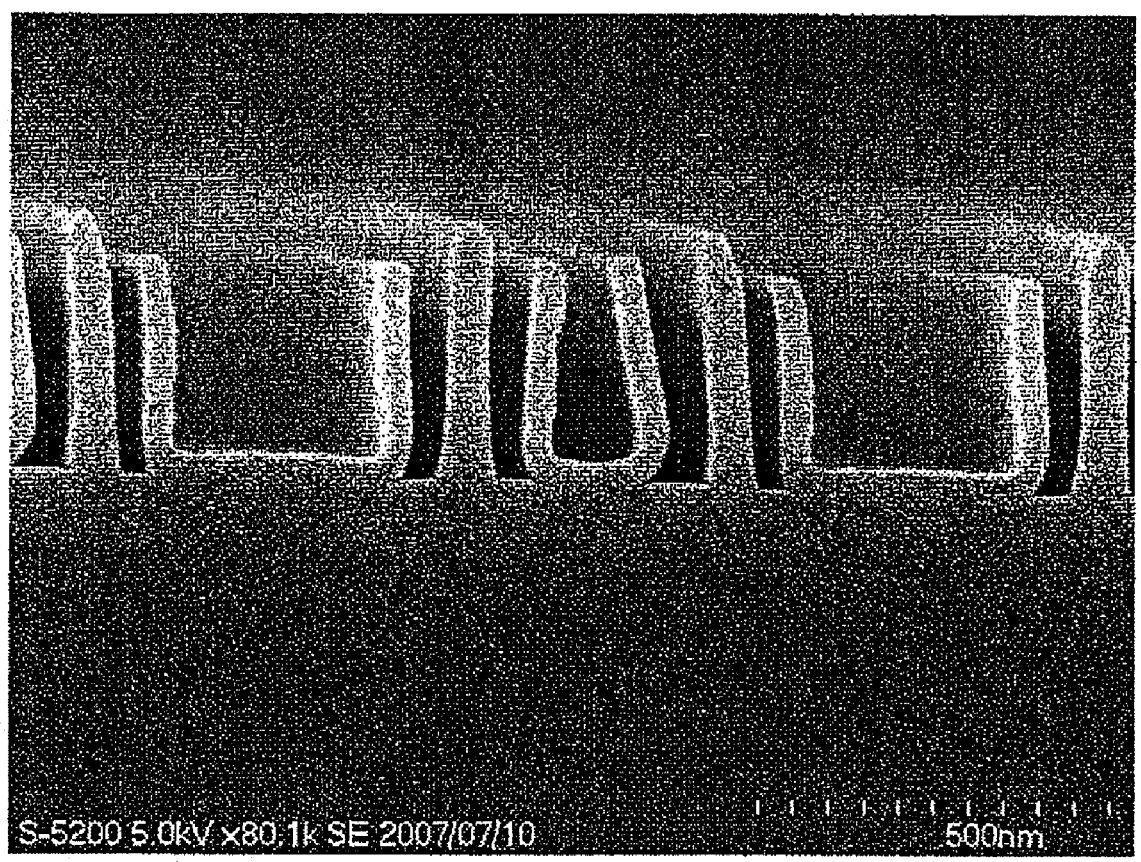
FIG. 8 is a scanning electron microscope image of a structure formed on a substrate in Example 4.

The surface of the resulting substrate was inspected using a scanning electron microscope. FIG. 8 shows a scanning electron microscope image of the substrate surface.

As shown in FIG. 8, it was confirmed that, as a result of the series of operations described above, silica lines (nanostructures) having a width of approximately 33 nm and a height of 300 to 270 nm had been formed. Further, in this example, six silica lines had been formed from a single template (rectangular line structure).

Moreover, the spacing between adjacent silica lines was 45 nm at its narrowest, with this spacing corresponded with the film thickness of the polymer layer that was sandwiched between the two silica layers.

Furthermore, it was also evident that these silica lines had a high aspect ratio relative to the line width (in this example, the height/width ratio was approximately 8), and that the silica lines exhibited favorable self-supporting properties.

INDUSTRIAL APPLICABILITY

The present invention is able to provide a production method that enables the simple production of a microscopic structure of favorable shape, as well as a structure produced using this production method, and is therefore extremely useful industrially.

What is claimed is:

1. A method of producing a structure, comprising:
   a composite film formation step that forms a composite film composed of a coating film and an organic film or inorganic film on top of a substrate by conducting Steps (1) to (3) below:
   (1) forming said coating film, which is composed of a metal layer or a metal oxide layer, on a surface of a template provided on top of said substrate,
   (2) forming said organic film or inorganic film on a surface of said coating film, and
   (3) removing a portion of said organic film or inorganic film and a portion of said coating film;
   a second coating film formation step that forms a second coating film composed of a metal layer or a metal oxide layer on a surface of said composite film;
   a coating step that, following formation of said second coating film, forms an organic coating film on said substrate that covers said second coating film;
   a removal step that removes a portion of said second coating film, side surfaces of which are at least partially supported by said organic coating film; and
   a structure formation step that forms a structure composed of a metal layer or metal oxide layer on said substrate, by removing all residues left on said substrate except for said coating film and said second coating film.

2. A method of producing a structure according to claim 1, wherein
   in said composite film formation step, following said Step (3), a series of steps from Step (1') to Step (3') described below is performed at least once, said series of steps comprising:
   (1') forming a coating film composed of a metal layer or a metal oxide layer on a surface of said organic film or inorganic film that has had a portion removed,
   (2') forming an organic film or inorganic film on a surface of said coating film, and
   (3') removing a portion of said organic film or inorganic film and a portion of said coating film.

3. A method of producing a structure according to claim 1, wherein in said composite film formation step, following said Step (1) but prior to said Step (2), a portion of said coating film and said template are removed.

4. A method of producing a structure according to claim 1, wherein said removed portion of said coating film is a top portion of said coating film.

5. A method of producing a structure according to claim 1, wherein in said coating step, said organic coating film is formed with a film thickness that exceeds a height of said second coating film.

6. A method of producing a structure according to claim 1, wherein said metal oxide layer is formed using a metal oxide layer-forming material prepared by dissolving a metal compound (W) that is capable of forming a hydroxyl group by hydrolysis in a solvent (S).

7. A method of producing a structure according to claim 6, wherein said metal compound (W) is a silicon compound having two or more isocyanate groups and/or halogen atoms.

8. A method of producing a structure according to claim 6, wherein said solvent (S) is a solvent (S1) having no functional groups that react with said metal compound (W).

9. A method of producing a structure according to claim 1, wherein said organic film is formed using an organic film-forming material composed of a first aqueous solution comprising a water-soluble resin (A1) having sites that adopt a positive charge within an aqueous solution, and a second aqueous solution comprising a water-soluble resin (A2) having sites that adopt a negative charge within an aqueous solution.

10. A method of producing a structure according to claim 9, wherein said organic film is formed by alternately bringing said first aqueous solution and said second aqueous solution of said organic film-forming material into contact with a surface of said coating film.

11. A method of producing a structure according to claim 1, wherein said template is formed from a template-forming material comprising an organic compound with a molecular weight of at least 500.

12. A method of producing a structure according to claim 11, wherein said template-forming material is a resist composition.

* * * * *

UNITED STATES PATENT AND TRADEMARK OFFICE
CERTIFICATE OF CORRECTION

PATENT NO.       : 8,025,923 B2
APPLICATION NO.  : 12/202972
DATED            : September 27, 2011
INVENTOR(S)      : Shigenori Fujikawa et al.

It is certified that error appears in the above-identified patent and that said Letters Patent is hereby corrected as shown below:

On the title page, item (75), under inventors, please change "Takaemoto" to --Takemoto--.
In Column 8, Line 13, Change ""α-lower alkyl)" to --"(α-lower alkyl)--.
In Column 8, Line 17, Change "α-lower alkyl)" to --(α-lower alkyl)--.
In Column 9, Line 17, (Approx.), Change "halo generated" to --halogenated--.
In Column 12, Line 44, Change "$R^{4"}$" to --$R^{4'}$--.
In Column 12, Line 46, Change "$R^{4"}$" to --$R^{4'}$--.
In Column 13, Line 27, Change "α-lower alkyl)" to --(α-lower alkyl)--.
In Column 13, Line 28, Change "α-lower alkyl)" to --(α-lower alkyl)--.
In Column 13, Line 32, Change "α-lower alkyl)" to --(α-lower alkyl)--.
In Column 13, Line 44, Change "α-lower alkyl)" to --(α-lower alkyl)--.
In Column 13, Line 57, Change "α-lower alkyl)" to --(α-lower alkyl)--.
In Column 14, Line 59, Change "α-lower alkyl)" to --(α-lower alkyl)--.
In Column 14, Line 63, Change "α-lower alkyl)" to --(α-lower alkyl)--.
In Column 16, Line 62, Change "7-butyrolactone," to --γ-butyrolactone,--.
In Column 24, Lines 47-48, Change "13.5 µm)" to --13.5 nm)--.
In Column 43, Lines 32-37, (Approx.), (Structure 13), Change " 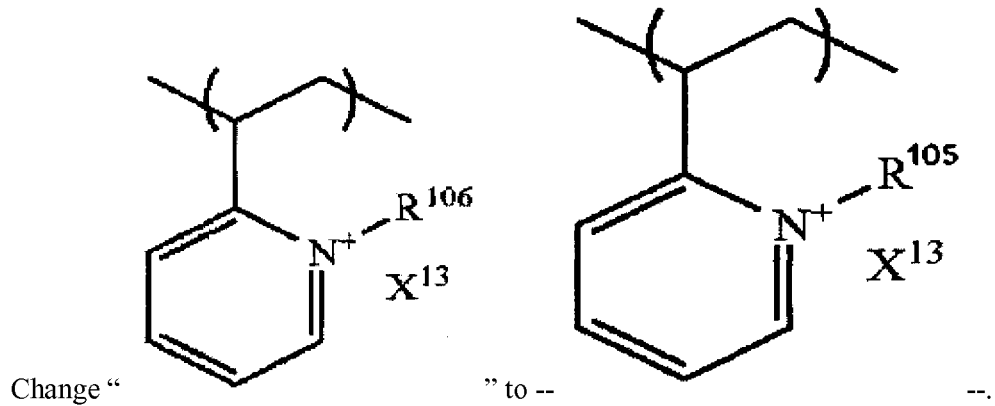 " to -- --.

Signed and Sealed this
Third Day of April, 2012

David J. Kappos
*Director of the United States Patent and Trademark Office*

CERTIFICATE OF CORRECTION (continued)
U.S. Pat. No. 8,025,923 B2

In Column 58, Line 15, Change "FIG. 2(f')," to --FIG. 2(f'),--.
In Column 58, Line 18, Change "(Step (f'))." to --(Step (f')).--.
In Column 60, Line 56, Change "780 nm n." to --780 nm.--.